US006534133B1

(12) United States Patent
Kaloyeros et al.

(10) Patent No.: US 6,534,133 B1
(45) Date of Patent: Mar. 18, 2003

(54) METHODOLOGY FOR IN-SITU DOPING OF ALUMINUM COATINGS

(75) Inventors: Alain E. Kaloyeros, Slingerlands, NY (US); Andres Knorr, Fishkill, NY (US); Jonathan Faltermeier, Fishkill, NY (US)

(73) Assignee: Research Foundation of State University of New York, Albany, NY (US)

( * ) Notice: Subject to any disclaimer, the term of this patent is extended or adjusted under 35 U.S.C. 154(b) by 0 days.

(21) Appl. No.: 09/607,900

(22) Filed: Jun. 30, 2000

Related U.S. Application Data

(63) Continuation-in-part of application No. 08/882,751, filed on Jun. 13, 1997, now abandoned.
(60) Provisional application No. 60/019,948, filed on Jun. 14, 1996.

(51) Int. Cl.[7] ............................................. C23C 16/20
(52) U.S. Cl. ................. 427/576; 427/252; 427/255.7; 438/680; 438/681; 438/687; 438/688
(58) Field of Search ..................... 427/250, 252, 427/255.7, 576; 438/680, 681, 687, 688

(56) References Cited

U.S. PATENT DOCUMENTS 4,849,260 A * 7/1989 Kusumoto et al.
5,087,485 A * 2/1992 Cho ............................ 427/250
5,273,775 A  12/1993 Dyer et al. ................... 427/99
5,376,409 A * 12/1994 Kaloyeros et al.
5,453,305 A * 9/1995 Lee

FOREIGN PATENT DOCUMENTS

| JP | 03-047966 | * | 2/1991 |
| JP | 06-275721 | * | 9/1994 |
| WO | WO 97 47783 | | 12/1997 |

* cited by examiner

Primary Examiner—Timothy Meeks
(74) Attorney, Agent, or Firm—Heslin Rothenberg Farley & Mesiti P.C.; Mary Louise Gioeni, Esq.

(57) ABSTRACT

A chemical vapor deposition process for the in-situ preparation of conformal copper-doped aluminum coatings on a substrate comprises the steps of generating a first flow of a first reactant vapor directed to the substrate in the reactor, the first reactant vapor including a copper source precursor; heating the substrate to a temperature sufficient to decompose the first reactant vapor and form an ultrathin copper seed layer; generating a second flow of a second reactant vapor directed to the substrate in the reactor, the second reactant vapor including an aluminum source precursor; and heating the substrate to a temperature higher than 185° C. to decompose the second reactant vapor and form a copper-doped aluminum film.

26 Claims, 16 Drawing Sheets

SCHEMATIC REPRESENTATION OF REACTOR USED FOR CVD AND PACVD OF Al-Cu

CS-SEM SHOWING THE EFFECTS OF USING A Cu SEED LAYER FOR THE CVD GROWTH OF COPPER-DOPED Al FILMS (a) WITHOUT Cu DOPING (b) WITH Cu DOPING

— 1 μm

CS-SEM SHOWING THE EFFECTS OF USING A Cu SEED LAYER FOR THE CVD GROWTH OF COPPER-DOPED Al FILMS UNDER THE SAME PROCESSING CONDITIONS AS THE SAMPLES SHOWN IN FIG. 11, EXCEPT THREE TIMES HIGHER Al PRECURSOR FLOW (a) WITHOUT Cu DOPING (b) WITH Cu DOPING

— 1 μm

METHODOLOGY FOR IN-SITU DOPING OF ALUMINUM COATINGS

CROSS REFERENCE TO RELATED APPLICATIONS

This application is a continuation-in-part of application Ser. No. 08/882,751, filed Jun. 13, 1997, now abandoned which claims the benefit of U.S. Provisional Application No. 60/019,948, filed Jun. 14, 1996.

FIELD OF THE INVENTION

The present invention relates to conformal doped aluminum coatings on a patterned substrate and a methodology and apparatus to prepare such doped coatings. More particularly, the present invention is directed to the controlled, reproducible growth by thermal or plasma-assisted CVD (PACVD) processes of ultrathin Cu layers which are subsequently used as seed surface for the in-situ thermal or plasma assisted chemical vapor deposition of smooth, void-free, and dense copper-doped aluminum films which conformally coat semiconductor device substrates with patterned holes, vias, and trenches with aggressive aspect ratios (hole depth/hole width ratios).

BACKGROUND OF THE INVENTION

The ever increasing demand for higher density and enhanced performance in deep sub-quarter micron integrated chip (IC) device technologies is placing enormous pressure on intrachip interconnect architecture development. Predictions published in the Semiconductor Industry Association Technology Roadmap for Semiconductors, See The International Technology Roadmap for Semiconductors, 1999 Edition (Semiconductor Industry Association, San Jose, Calif., 1999), indicate that the emerging needs of advanced logic and microprocessor systems could require over ten levels of interconnects. One of the key problems in the generation of these multiple conductor levels involves the fabrication of well-defined and precisely-patterned vertical electrical connections (vias) between different interconnect planes of the chip.

As the traditional building block of the IC interconnects, Al alloys have played a major role in the evolution of the computer age. When alloyed with 0.5 wt % copper, Al exhibits enhanced electromigration resistance while maintaining good electrical conductivity. In addition to its ability for self passivation in air and ease of patternability in chlorine based plasmas, Al bonds well to $SiO_2$ and diffusion barriers of titanium nitride and titanium. See S. P. Murarka, Metallization: Theory and Practice for VLSI and ULSI (Butterworth-Heinemann, Boston, 1993). In light of these properties, Al based metallizations are predicted not only to continue as the interconnection workhorse of the integrated circuit industry in the foreseeable future, but will extend their role in providing contact and via hole plugs for all wiring levels.

Unfortunately, in the past decade, the deposition of Al alloys into small vertical holes cut into interlevel dielectrics has become increasingly problematic as feature sizes decrease below half micron. Poor metal step coverage and the resulting incomplete filling of vias with physical vapor deposited (PVD) Al alloys generated serious process and reliability concerns. Al reflow and other high temperature Al alloy sputtering, or physical vapor deposition (PVD), processes are presently being explored and implemented as potential low cost alternatives which provide conformal via fill and ease in integration in device fabrication process flow. However, the repetitive exposure to high deposition temperatures required in a multilevel metal (MLM) architecture may adversely affect the device during processing. Secondly, the need for high temperature may greatly restrict the implementation of a number of new low dielectric constant materials into future interconnect architectures. The high temperature excursions could also result in barrier failure, which would be problematic at the contact level and lead to undesirable levels of junction leakage. See P. Singer, Semiconductor International 17 (1994) 57.

Chemical vapor deposition (CVD) of Al presents a viable alternative to PVD due to its inherent ability to grow films conformally on via and trench structures. Efforts to develop CVD Al deposition techniques date as far back as the late 1940s, wherein a variety of chemical sources were used which included Al halide, alkyl, and organometallic sources. See, for example, C. F. Powell, J. H. Oxley, and J. M. Blocher, Jr., Vapor Deposition (Wiley, New York, N.Y., 1966) p. 27; and H. J. Cooke, R. A. Heinecke, R. C. Stern, and J. W. C. Maas, Solid State Technol. 25 (1982) 62. The resulting Al films, regardless of the chemical source used, exhibited extensive surface roughness, high resistivity, and substantial contamination. Attempts to re-investigate these systems for device applications were revived in the mid-1980s. In these cases, evaluations were performed of Al CVD films generated from metal-organic sources such as tri-isobutyl aluminum (TIBA). See, for example, B. E. Bent, R. G. Nuzzo, and L. H. Dubois, J. Am. Chem. Soc. 111 (1989) 1634, H. O. Pierson, Thin Solid Films, 45 (1977) 257; and R. A. Levy, P. K. Gallagher, R. Contolini, and F. Schrey, J. Electrochem. Soc. 132 (1985) 457. In these initial batch process type studies, which used hot wall CVD reactors, carbon contamination, surface roughness, and low deposition rates posed unacceptable process problems. These unsuccessful experiments were prematurely abandoned in favor of more mature and manufacturable CVD tungsten metallization processes.

Tungsten CVD use could probably continue below the 0.1 $\mu$m device technology, as equipment suppliers focus their efforts on enhancing throughput, reducing particles, and improving cost-of-ownership. See P. Singer, Semiconductor International 17 (1994) 57. However, the cost associated with the deposition and etchback of CVD tungsten is substantially higher than of its Al alloy counterpart. Additionally, the use of Al alloy plug, with its approximately 100% lower electrical resistance (R) than its tungsten counterpart, provides the promise of substantially reduced RC delay, where C is the capacitance of the insulator. These expectations have revived interest in the development of a low temperature CVD based process for Al/0.5 at % Cu that is capable of filling small, high aspect ratio holes that are patterned in thermally fragile plastic-like, low dielectric constant organic polymers. Most recent CVD aluminum work has focused on the use of metal-organic precursors of the type diethylmethylaluminum alane or DMEM and dimethylaluminum hydride or DMAH. See, for instance, M. E. Gross, K. P. Cheung, C. G. Fleming, J. Kovalchick, and L. A. Heimbrok, J. Vac. Sci. Technolo. A9 (1991) 1; M. E. Gross, L. H. Dubois, R. G. Nuzzo, and K. P. Cheung, Mat. Res. Symp. Proc., Vol 204 (MRS, Pittsburgh, Pa., 1991) p. 383; W. L. Gladfelter, D. C. Boyd, and K. F. Jensen, Chemistry of Mater. 1 1989) 339; D. B. Beach, S. E. Blum, and F. K. LeGoues, J. Vac. Sci. Technol. A 1989) 3117. The molecular structure of these precursors is distinguished by the presence of aluminum-hydrogen (i.e. Al—H) bonds. This feature provided a clean chemical pathway to eliminate the precursor's hydrocarbon groups at relatively low temperatures to yield pure aluminum films. More specifically, the $AlH_3$ groups in DMEAA, and the Al—H groups in DMAH permitted pure aluminum film growth at temperatures as low as, respectively, 100° C. and 200° C. This feature made these compounds the candidates of choice in most on-going Al CVD development activities, and led to the successful growth of device-quality aluminum with conformal step coverage for substrates having aggressive holes and trenches (i.e., with a diameter of 0.25 µm or smaller) and high aspect ratios (i.e., the ratio of hole depth to hole width equal to or greater than about 4:1).

In spite of the recent success of both PVD processing, such as Al reflow, and CVD processing, both thermal and plasma assisted, at the formation of device-quality Al thin films, there exists a critical need for a processing technology to provide doped aluminum films (aluminum with a few percent of other elements, such as copper, carbon, tungsten, tantalum, titanium, palladium, gold, silver, platinum, silicon, germanium, samarium, zirconium, palladium, magnesium, etc.) suitable for ULSI fabrication. Copper doping is needed to significantly enhance aluminum's resistance to electromigation and allow aluminum interconnects to sustain the high current densities ($>10^6$ $A/cm^2$) required for proper operation of the IC devices. The Cu doped Al films must be of especially ultra high quality, in terms of purity, with impurity concentrations well below 1 atomic percent, must exhibit excellent electromigration properties, must be highly specular, with extremely smooth surface morphology, and must be conformal to the complex topography of ULSI circuitry to provide complete filling of aggressive via and trench structures.

In this respect, Dyer et al. (U.S. Pat. No. 5,273,775) disclose a chemical vapor deposition process for the selective growth of Al—Cu alloys by selectively depositing a copper layer on the conducting regions of a patterned silicon substrate and then depositing an aluminum layer over the copper layer. The copper and aluminum layers were annealed to form an aluminum copper alloy film. It was necessary to limit the temperature for the aluminum deposition to below 180° C. to achieve selective Al growth. Loss of selectivity was observed even when the substrate temperature was only slightly increased 185° C. This temperature limitation prevented the in-situ formation of copper-doped aluminum, and necessitated the introduction of an annealing step subsequently to the deposition of the Cu and Al layers to ensure the growth of copper-doped aluminum. In addition, it is known in the art that the formation of large aluminum grains during a low temperature deposition can lead to a porous, highly-resistive, aluminum film. Therefore, there is a need for a process that allows the preparation of copper-doped aluminum films in-situ, i.e., where copper diffuses through the aluminum layer as it is being formed, and without the need for subsequent annealing to drive copper into the aluminum layer and completely alloy the copper and aluminum layers to form a homogeneous copper-doped aluminum film.

It is also highly desirable that the copper and aluminum deposition steps be performed without any intermediate exposure to air due to the high affinity of aluminum to oxygen. Oxygen contamination would result in oxidized, highly resistive, aluminum films which are not appropriate for computer chip interconnect applications. To avoid undesirable air exposure and associated film oxidation, the deposition of the copper and aluminum layers must be carried out in the same reaction chamber, i.e., without the necessity of transferring a substrate coated with a single film (Al or Cu) to another reaction chamber to deposit the other film. Alternatively, deposition of the Al and Cu layers could be performed sequentially in two separate reaction chambers that are connected by a vacuum tight substrate handling system or load lock that allows substrate transfer between the individual reaction chambers without exposure to air.

Other workers have successfully produced in-situ copper doped aluminum films. Aluminum films doped with 0.7–1.4 wt % copper were grown through the simultaneous decomposition in the same CVD reactor of dimethylaluminum hydride (DMAH) and cyclopentadienyl copper triethylphosphine which were employed, respectively, as the aluminum and copper sources. See T. Katagiri, E. Kondoh, N. Takeyasu, T. Nakano, H. Yamamoto, and T. Ohta, Jpn. J. Appl. Phys. 32 (1993) L1078. Unfortunately, the copper source used in the work was highly reactive and unstable during transport and handling, which makes it undesirable for real industrial applications. Clearly, there is a critical need for stable copper sources which are free of oxygen, fluorine, and halides, and which are compatible with aluminum precursors to prevent any cross-contamination effects during film growth. The unavailability of copper source precursor with these properties target specifications stated above necessitates the development of an in-situ deposition of sequential bilayers of Al and Cu.

In this respect, it is extremely desirable that a process be developed which can control the deposition of the Cu layers down to extremely low thicknesses, e.g., below 2 nm. This feature is required to ensure that, upon annealing or mixing with aluminum, copper concentration in the doped aluminum film does not exceed 0.5 wt %. This upper limit is needed to prevent any problems in the subsequent Al interconnect etching and patterning steps, although recent technological advances in these areas could eventually push that number to values as high as 3 to 5 wt %. The process must allow deposition of a bilayered stack consisting of an ultrathin Cu layer followed by Al. The latter is particularly desired because copper is known to inhibit undesirable aluminum grain growth through alloying. Additionally, copper's use as growth surface in aluminum CVD provides a good seed layer for the uniform nucleation of aluminum grains, leading to smaller grain size and significantly smoother morphology, as desired in microelectronics applications.

In addition, the process must be flexible to allow use of thermal CVD processing for ultrathin copper films in combination with plasma assisted CVD of aluminum or vice versa. In this respect, it might be desirable in some instances to use PVD techniques, such as sputtering, reflow, plating, or electroplating, in combination with, or in lieu of, the CVD approaches described above to deposit one or both metallic layers. Similarly, substrate bias could be applied to the substrate during either deposition step. The purpose is to form a "soft" plasma region above the substrate to assist in the actual decomposition process, and/or attract ionized aluminum or copper ions to the various topographical regions of the substrate, leading to more conformal via and trench filling

SUMMARY OF THE INVENTION

The invention includes a method and apparatus for the chemical vapor deposition of conformal copper-doped aluminum layers on substrates. Primarily, the invention deposits copper-doped aluminum metallization layers on semiconductor substrates, such as silicon and gallium arsenide. The invention deposits the two metals in-situ, sequentially, with ultrathin copper layer being deposited first and used as seed layer in the deposition of smooth aluminum films with the grain size and texture required for microelectronics applications. With this invention, aluminum films are deposited onto the copper layer in a manner that allows the use of this layer as a "reservoir" or supply of copper atoms that interact with the aluminum film as it is growing to inhibit the formation of void-rich, low-density, high-resistivity aluminum films with large grain size and high surface roughness. According to this invention, the aluminum film is grown on the copper seed layer at a temperature higher than 185° C. to initiate interaction between the copper and aluminum while the Al film is growing. This characteristic is essential to drive the partial diffusion of copper through the CVD Al layer as it is growing to ensure that Cu is inhibiting the nucleation of large aluminum grains. Otherwise, the formation of large aluminum grains leads to a porous, highly-resistive, aluminum film that is not usable in microelectronics interconnect applications.

Also in accordance with this invention, sequentially deposited copper-aluminum layers could then be annealed in-situ or ex-situ to complete the formation of a completely homogeneous copper-doped aluminum film. The Cu, Al, and in-situ annealing could take place either in the same reactor, in two separate reactors, one used for deposition and the other for annealing, or in three separate reactors. In the cases when more than one reactor is used, it is preferred that the reactors be inter-connected through leak-tight transfer arms/load locks. The transfer arms/load locks allow sample transfer between the different reactors without exposure to air. Alternatively, the invention provides for depositing the aluminum film on the copper seed layer at a temperature sufficient to form a smooth, copper-doped, aluminum film without the need for the annealing step.

The invention provides a means to accurately and repeatably transport copper precursor gas to the reaction zone at a rate and flux which allow reproducible deposition of ultrathin copper layers, e.g., as thin as 1.0–1.5 nm, within 0.1 to 0.2 nm accuracy. The invention uses copper source precursors which have been diluted in a precursor carrier medium at significantly reduced precursor concentration levels. With the invention, any suitable copper precursor can be used, regardless of whether it is a solid, liquid or gas. For solid or liquid copper source precursors, the precursor carrier medium could include solvents, water, or an adducted form of the source precursor. In this case, the mixture of copper precursor and associated medium can be vaporized prior to its introduction to the reaction zone, or inside the reaction zone. In the case of gaseous copper source precursors, the precursor carrier medium could include inert gases such as nitrogen, argon, xenon, or helium, or more active gases such as hydrogen. The invention uses highly diluted precursor concentrations to enable tight control over precursor transport and delivery rates, and to ensure the delivery of very low fluxes of copper precursor gas to the reaction zone. Substantially, any precursor delivery system, including pressure-based bubblers, liquid delivery systems, direct liquid injection systems, standard and hot source mass flow controllers, can be used to deliver the mixtures of precursor and carrier medium to the reaction zone.

The invention also provides a heat assisted chemical vapor deposition process and apparatus. With the invention, copper then aluminum are deposited sequentially on the substrate. This process is carried out using copper and aluminum precursor gases in combination with the precursor transport means discussed above. As in the case of the copper precursors, the aluminum precursors could be solid, liquid, or gaseous at room temperature, and could be heated to transform them into a gas which is easily transportable to the reactor. For both copper and aluminum, the precursors gases are transported with suitable carrier gases such as hydrogen, argon, nitrogen, or a mixture thereof. Deposition takes place in a reactor at pressures ranging from one atmosphere to high vacuum and at temperatures above 185° C., in order to facilitate initiate interaction between the copper and aluminum while the Al film is growing. Under these conditions, copper partially diffuses through the Al layer as it is growing and inhibits the nucleation of large aluminum grains. Otherwise, as well known by those who are skilled in the art, the formation of large aluminum grains leads to a porous, highly-resistive, aluminum film that is not usable in microelectronics interconnect applications.

The invention also provides for plasma, light, or laser assisted chemical vapor deposition. It uses the energy provided by the plasma, light, or laser to deposit either the copper or aluminum layer, or both. In these cases, an electrical bias could be applied to the substrate at power densities ranging from 0.005 W/cm$^2$ to 100 W/cm$^2$ and frequencies ranging from 1 Hz to $10^8$ kHz. The local electrical field in the region above and at the surface of the substrate enhances the rate of impingement of copper and aluminum ions from the copper and aluminum precursor gases, leading to more conformal coating of the topographies of microelectronics device structures.

Four key aspects of the invention are: (a) the application of an ultrathin (<10 nm) copper layer as a seed layer in the deposition of smooth, copper-doped, aluminum films. The aluminum films are deposited at temperatures above 185° C. to allow copper atoms from the ultrathin seed layer to interact with the growing aluminum film to inhibit undesirable large grain growth and yield texture and composition required for microelectronics applications, (b) the use of mixtures of copper source precursors which have been diluted in a precursor carrier medium at significantly reduced precursor concentration levels to allow accurate and repeatable copper precursor transport to the reaction zone at a rate and flux which allow reproducible deposition of ultrathin copper layers, e.g., as thin as 1–1.5 nm, within 0.1–0.2 nm accuracy, (c) the use of copper source precursors of low volatility, in combination with the approach described under (b) above, in cases when additional, tighter, control on ultrathin layer thickness is required, and (d) the application of a substrate bias, when needed, to form a soft plasma region above the substrate and enhance the rate of impingement of copper and aluminum ions from the copper and aluminum precursor gases, leading to more conformal coating of the topographies of microelectronics device structures.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings:

FIG. 4 shows that complete Cu diffusion occurred at 300° C., with no Cu seed remaining at the Al/substrate interface.

In FIG. 13(a), aluminum was deposited directly on the overhang structure by conventional CVD without using the copper seed layer. In FIG. 13(b), the present invention was applied to grow an Al—Cu stack consisting of approximately 1 µm-thick Al film on an ultrathin copper seed layer. A comparison of the two cross sections demonstrates how the ultrathin copper seed layer inhibits undesirable large aluminum grain growth, yielding the texture and composition required for microelectronics applications.

In FIG. 14(a), aluminum was deposited directly on the overhang structure by conventional CVD without using the copper seed layer. In FIG. 14(b), the present invention was applied to grow an Al—Cu stack consisting of approximately 1 µm-thick Al film on an ultrathin copper seed layer. A comparison of the two cross sections demonstrates how the ultrathin copper seed layer inhibits undesirable large aluminum grain growth, yielding the texture and composition required for microelectronics applications.

DETAILED DESCRIPTION OF THE INVENTION

Figure 1:
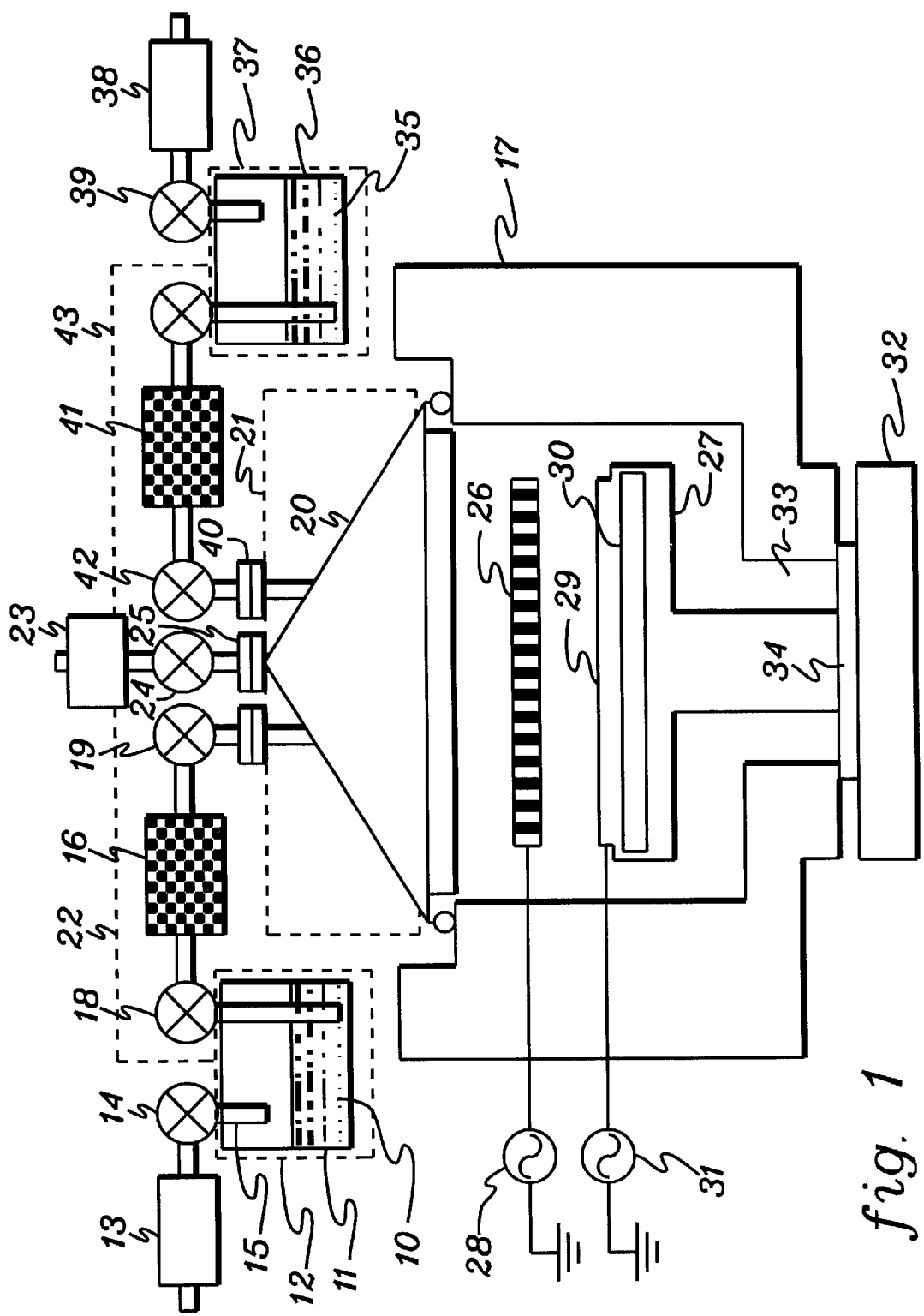
FIG. 1 is a diagrammatic representation of the reaction apparatus used to achieve chemical vapor deposition and plasma assisted chemical vapor deposition according to the present invention.

The invention includes CVD-based processes that prepare copper-doped aluminum films which are suitable as signal conductors (both plug and interconnect) in integrated circuit fabrication, and in particular in ULSI computer device fabrication and beyond. The process of the invention directs carefully selected precursors to a thermal or plasma assisted CVD reactor, under carefully specified reaction conditions, for the in-situ deposition of ultrathin copper layers which are subsequently used as seed layer in the deposition of smooth copper-doped aluminum films with the grain size and texture required for microelectronics applications. With this invention, aluminum films are deposited onto the copper layer in a manner that allows the use of this layer as a "reservoir" or supply of copper atoms that interact with the aluminum film as it is growing to inhibit the formation of void-rich, low-density, high-resistivity aluminum films with large grain size and high surface roughness. According to this invention, the aluminum film is grown on the copper seed layer at a temperature higher than 185° C. to initiate interaction between the copper and aluminum while the Al film is growing. At these temperatures, copper partially diffuses through the CVD Al layer as it is growing, inhibiting the nucleation of large aluminum grains. This prevents the formation of large aluminum grains, and the resulting porous, highly-resistive, aluminum film that is not usable in microelectronics interconnect applications.

According to this invention, sequentially deposited copper-aluminum layers may be annealed in-situ or ex-situ to complete the formation of a completely homogeneous copper-doped aluminum film. The Cu, Al, and in-situ annealing may take place either in the same reactor, in two separate reactors, one used for deposition and the other for annealing, or in three separate reactors. In the cases when more than one reactor is used, it is preferred that the reactors be inter-connected through leak-tight transfer arms/load locks. The transfer arms/load locks allow sample transfer between the different reactors without exposure to air. Alternatively, the invention provides for depositing the aluminum film on the copper seed layer at a temperature sufficient to form a smooth, copper-doped, aluminum film without the need for the annealing step.

As used herein, the term "aluminum film" is used to refer to a film made from pure aluminum metal. Also, the term "doped aluminum film" is used to refer to a film made from blends of aluminum metal and a second metal which is selected from Groups Ib, IIb and VIIIb of the Periodic Table, such as copper. Also the term "bilayered aluminum film" refers to bilayers formed from any of aluminum metal, copper metal and blends thereof, which are either deposited in-situ in at a temperature sufficient to form a copper-doped aluminum film without the need for the annealing step, or are subsequently annealed to yield an aluminum-copper alloy.

According to one embodiment of the present invention, the formation of copper or aluminum films is achieved by using plasma assisted CVD (PACVD), which refers to a CVD process wherein all reactants are introduced to the CVD reactor in gaseous form, and the energy necessary for bond cleavage is supplied partially by the high energy electrons formed in glow discharges or plasmas of light ions (primarily hydrogen or helium) with low plasma power densities (below 0.25 W/cm$^2$). As such, our plasma assisted CVD (PACVD) technique takes advantage of the high energy electrons present in glow discharges to assist in the dissociation of gaseous molecules, as is the case with plasma enhanced CVD (PECVD), thus leading to film formation at lower substrate temperatures than in thermal CVD processes. However, in contrast to PECVD, the use of low power densities in PACVD prevents undesirable precursor decomposition in the gas phase, thus minimizing the potential for precursor decomposition in the gas phase and film contamination, and inhibiting electrical damage to film and substrate. Additionally, the use of light ions (hydrogen or helium) in PACVD prevents mechanical and structural damage to film and substrate, which results from the impingement of heavy ions such as argon in PECVD. According to one preferred method, the plasma is generated through use of radio frequency (RF) glow discharges, although plasmas with frequencies ranging from kHz to GHz could be employed. See, generally, Hess, D. W. and Graves D. B., "Plasma-Assisted Chemical Vapor Deposition", chapter 7 in "Chemical Vapor Deposition, Principles and Applications", Hitchman M. L. and Jensen, K. F. eds., Academic Press (1993). The plasma may be a direct current plasma, a radio frequency plasma, a low frequency plasma, a high frequency plasma, an electron cyclotron plasma, an inductively coupled plasma, or a microwave plasma. According to another embodiment of the present invention, the formation of copper or aluminum films is achieved by using plasma processing, including PECVD, or PACVD in combination with substrate bias. We discovered that applying a substrate bias during plasma processing provides excellent conformal coverage of features intrinsic in microelectronic device manufacture. Substrate bias leads to a significant enhancement in the flux of metal ions impinging on the substrate and a corresponding increase in the re-emission probability of such atoms inside via and trench structures. These re-emission processes are known to create improved step coverage in patterned holes, vias, and trenches with aggressive aspect ratios (0.25 $\mu$m features with 4 to 1 aspect ratios and beyond). This feature is especially useful when the CVD growth mode is reaction rate limited, or when the flux of precursor species to the CVD reaction zone is restricted to significantly reduced concentrations. The electrical bias on the substrate may be choosen from direct current (dc), low radio frequency (<500 kHz), high radio frequency (500 kHz–$10^6$ kHz), and microwave frequency ($10^6$ kHz–$10^8$ kHz).

The present invention can be used with any CVD reactor which has the following basic components: a precursor delivery system which is used to store and control the delivery of the source precursor, a vacuum chamber and pumping system to maintain an appropriately reduced pressure; a wafer and reactor temperature control system, and gas or vapor handling capabilities to meter and control the flow of reactants and products that result from the process. Additional features that are needed to implement specific embodiments of the present invention include a power supply to create the discharge and/or a power supply to apply a bias to the substrate.

According to one preferred embodiment for the deposition of doped Al films, the CVD reactor shown in FIG. 1 was employed. The copper source precursor 10 is placed in the reservoir (bubbler/sublimator) 11 which could be heated by a combination resistance heating tape and associated power supply 12 to a temperature which is high enough to ensure the sublimation or vaporization of the copper source, but not too high to cause its premature decomposition. A mass flow controller 13, which can be isolated from the bubbler by a high vacuum valve 14, is used to control the flow of gas (hydrogen, argon, xenon, or nitrogen) into the reservoir through inlet 15. This gas serves as carrier agent when a conventional pressure and/or temperature based mass flow control type delivery system 11 and 13 is employed to control the flow of precursor into the CVD reactor 17. Alternatively, the gas serves as a pressurizing agent when a liquid delivery system 16, consisting of a combination micropump and vaporizer head, such as the MKS Direct Liquid Injection (DLI) system, is applied to the delivery of the precursor to the CVD reactor 17. A third possibility is to use a hot source mass flow controller 16, such as an MKS Model 1150 MFC, which does not require the use of a carrier or pressurizing gas.

In any case, the delivery system is isolated from the precursor reservoir by a high vacuum valve 18, and the precursor vapor or (precursor+carrier gas) mixture vapors is then transported through a high vacuum isolation valve 19 and a cone-shaped shower head 20 into the CVD reactor 17. The shower head 20 is employed to ensure proper reactant mixing and uniformity in reactant delivery and flow over 8" wafers. In one embodiment, the cone was 18" high, and was designed with Conflat type top and bottom fittings. The bottom opening (towards the reactor) was 7", while the top opening was 1.3". It should be noted, however, that other commercially available shower head designs are equally effective at providing the reactant mixing capabilities and uniformity required. All transport and delivery lines and high vacuum isolation valves 18, 19, and 20 are maintained at the precursor sublimation/vaporization temperature, using typical combinations of resistance heating tapes and associated power supplies 21 and 22, to prevent precursor recondensation.

The reactor 17 is an 8" wafer, cold wall stainless steel CVD reactor. It is equipped with a parallel plate type plasma configuration made of two electrodes 26 and 27, with the reactor itself providing electrical grounding. The upper plate 26 serves as the active discharge electrode and is driven by a plasma generator 28, such as a radio frequency (13.56 MHz) power supply. This upper plate is constructed in a "mesh" type pattern to allow unconstricted reactant flow to the substrate 29. In all cases, a hydrogen plasma is used for in-situ pre-deposition substrate cleaning at plasma power densities in the range 0.1–0.25 W/cm$^2$. A mass flow controller 23, which can be isolated from the bubbler by a high vacuum valve 24, is used to ensure delivery of additional hydrogen, argon, or nitrogen flow to the reactor through the side feedthrough 25. The substrate (wafer) 29 is placed on the lower electrode 27, and is heated to processing temperatures in the range 185–450° C. by an 8" resistive heater 30. The lower plate also serves as the bias electrode and could be driven by a frequency generator 31, such as a low frequency (95–450 kHz) power supply, when, according to some preferred embodiments, thermal or plasma promoted CVD with biased substrate are used.

To guarantee process cleanliness, the reactor is periodically baked under a nitrogen or argon atmosphere to below 0.3 Torr and then pumped down to below $10^{-7}$ Torr for an hour at 150° C. The pumping stack 32 consists of two pumping packages, the first cryogenic or turbomolecular pump based, and the second roots blower pump based, and is isolated from the reactor high conductance pumping lines 33 by the high vacuum gate valve 34. The cryogenic pump based package is used to ensure high vacuum base pressure in the reactor, while the roots blower based package is employed for appropriate handling of the high gas throughput during actual CVD runs. A high vacuum load lock system is typically used for transport and loading of 8" wafers into the reactor.

For the subsequent aluminum deposition step, the aluminum source precursor 35 is placed in the reservoir (bubbler/sublimator) 36 which could be heated by a combination resistance heating tape and associated power supply 37 to a temperature which is high enough to ensure the sublimation or vaporization of the aluminum source, but not too high to cause its premature decomposition. A mass flow controller 38, which can be isolated from the bubbler by a high vacuum valve 39, is used to control the flow of gas (hydrogen argon, xenon, or nitrogen) into the reservoir through inlet 40. This gas serves as carrier agent when a conventional pressure or temperature based mass flow control type delivery system 36 and 38 is employed to control the flow of precursor into the CVD reactor 17. Alternatively, the gas serves as a pressurizing agent when a liquid delivery system 41, consisting of a combination micropump and vaporizer head, such as the MKS Direct Liquid Injection (DLI) system, is applied to the delivery of the precursor to the CVD reactor 17. A third possibility is to use a hot source mass flow controller 41, such as an MKS Model 1150 MFC, which does not require the use of a carrier or pressurizing gas.

In any case, the delivery system is isolated from the precursor reservoir by a high vacuum valve 42, and the precursor vapor or (precursor+carrier gas) mixture vapors is then transported through a high vacuum isolation valve 19 and a cone-shaped shower head 20 into the CVD reactor 17. All transport and delivery lines and high vacuum isolation valves 39, 40, and 42, are maintained at the aluminum precursor sublimation/vaporization temperature, using a typical combination of resistance heating tape and associated power supply 43, to prevent precursor recondensation.

We have discovered that the application of an ultrathin (<100 Å) copper layer as a seed layer plays a key role in the deposition of smooth, copper-doped, aluminum films with the texture and morphology needed for advanced microelectronics applications. This is attributed to the role of copper atoms from the ultrathin seed layer in interacting with the growing aluminum film to inhibit undesirable large grain growth and yield the texture and composition required for microelectronics applications. We have also discovered that when the aluminum films are deposited onto the copper layer in a manner that allows the use of this layer as a "reservoir" or supply of copper atoms that interact with the aluminum film as it is growing, the formation of void-rich, low-density, high-resistivity aluminum films with large grain size and high surface roughness is inhibited. This occurs at a temperature higher than 185° C. where copper diffuses through the CVD Al layer as it is growing to ensure that Cu is inhibiting the nucleation of large aluminum grains.

We have also discovered that the formation of the copper seed layer, wherein an ultrathin layer is needed, can be controlled reproducibly from run to run through using an appropriately composed flux of source copper precursor. This is achieved by employing mixtures of copper source precursors which have been diluted in a precursor carrier medium at significantly reduced precursor concentration levels to allow accurate and repeatable copper precursor transport to the reaction zone at a rate and flux which allow reproducible deposition of ultrathin copper layers, e.g., as thin as 10–15 Å, within 1–2 Å accuracy. We also discovered that additional, tighter, control on ultrathin layer thickness could be achieved by combining the approach above with using copper source precursors of low volatility.

We have also discovered that the application of a substrate bias, when needed, to form a soft plasma region above the substrate leads to significant enhancement in the rate of impingement on the substrate of copper and aluminum ions from the copper and aluminum precursor gases, leading to more conformal coating of the topographies of microelectronic device structures. Substrate bias leads to significant enhancement in the flux of copper and aluminum ions impinging on the substrate and a corresponding increase in the re-emission probability of such atoms inside via and trench structures. These re-emission processes are known to create improved step coverage in patterned holes, vias, and trenches with aggressive aspect ratios (0.25 μm features with 4 to 1 aspect ratios and beyond). This feature is especially useful when the CVD growth mode is reaction rate limited, or when the flux of precursor species to the CVD reaction zone is restricted to significantly reduced concentrations.

We have also discovered that by interfacing the aluminum and copper delivery systems as shown in FIG. 1, copper-doped aluminum films can be prepared in-situ, i.e., without the necessity of transferring a substrate coated with a single film (Al or Cu) to another reaction chamber to deposit the other film. This approach allows either in-situ deposition of sequential bilayers of Al and Cu followed by in-situ or ex-situ annealing. Our process can also be applied to coatings for refractive, mechanical, optoelectronic, or decorative applications in applications other than microelectronic.

The following examples are set forth as a means of illustrating the present invention and are not to be construed as a limitation thereon. All chemical vapor deposition studies were conducted in the custom designed cold-wall stainless-steel reactor described above and having a single 8 inch wafer, a parallel plate-type plasma configuration, and a load locked wafer transport system, as shown diagrammatical in FIG. 1. The aluminum source precursor employed in the practice of the present invention may be a trialkyl aluminum, a dialkylaluminum. hydride, an aluminum halide, an aluminum tris(β-diketonate), and alkyl amide aluminum, or a trialkylamine alane. Preferred alkyl groups are methyl, ethyl, n-propyl, isopropyl, n-butyl, isobutyl, or tert-butyl. Preferred compounds are triisobutylaluminum, tridiisobutylaluminum , trimethylaluminum, dimethylaluminum hydride, triethylaluminum and diethylaluminum hydride. Preferred aluminum halides include aluminum trichloride, and aluminum tribromide. Preferred trialkylamine alanes are dimethylethylamine alane, trimethylamine alane, and triethylamine alane.

Copper precursors suitable for use in the present invention are copper(I)-tert-butoxide-tetramers, cyclopentadienylcopper(I)-phosphine compounds, ligand stabilized copper(I) β-diketonates, and copper(II) β-diketonates.

EXAMPLES

Example 1

Study of the Effects of Substrate Temperature on the Formation of Al—Cu Alloys

Figure 2:
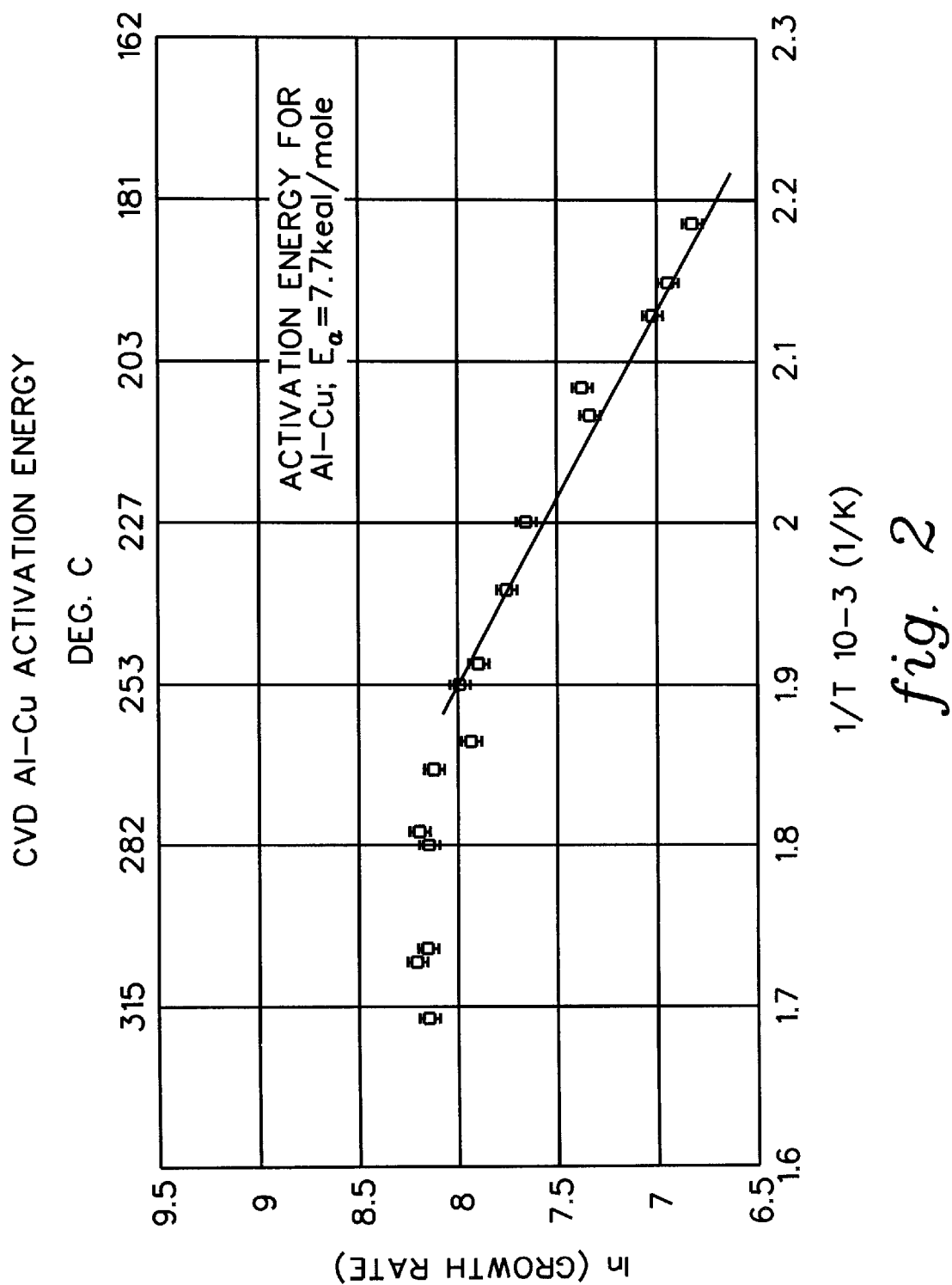
FIG. 2 is a typical Arrhenius plot of ln(growth rate) for CVD Al—Cu as a function of inverse of substrate temperature in degrees Kelvin. The absence of data points below a substrate temperature of 185° C. indicates that no Al—Cu films, having a surface which was sufficiently smooth and void-free to be used in microelectronics interconnect applications, were formed below that temperature.

In order to fully document the initiation of Cu diffusion in Al, and corresponding temperature window for the formation of Al—Cu alloys, a series of experiments were carried out in the reactor shown schematically in FIG. 1 in order to establish growth rate characteristics for CVD Al—Cu as a function of substrate temperature. In this respect, the CVD Al—Cu alloys were obtained by depositing CVD Al on a Cu seed layer. For this purpose, a set of 500 nm-thick Al—Cu alloys was formed on substrates consisting of 1.7 nm thick CVD Cu seed layer on 40 nm TiN on 20 nm Ti on Si (1.7 nm Cu/40 nm TiN/20 nm Ti/Si stacks). The Cu seed layer was deposited by plasma-promoted CVD using the processing conditions below:

Deposition temperature: 175° C.
RF plasma power: 0.06 W/cm$^2$
Duration: 30 sec.
H$_2$ carrier flow rate: 20 sccm
H$_2$ co-reactant flow rate: 500 sccm
Cu solution injection rate: 0.400 ccm
Cu source precursor: Copper bis-hexafluoroacetyl-acetonate, Cu(II)(hfac)$_2$
Cu solution concentration: 100 gr. Cu(II)(hfac)$_2$ per liter of isopropanol (IPA).
Process pressure: 0.8 torr For CVD Al, the processing conditions were:
Deposition temperature: varied
H$_2$ co-reactant flow rate: 500 sccm
Source Precursor: dimethyl aluminum hydride (DMAH)
Precursor flow rate: 40 sccm
Process pressure: 0.8 torr
Substrate: 1.7 nm Cu on 40 nm TiN on 20 nm Ti on Si The resulting films were analyzed by Rutherford backscattering spectrometry (RBS), Auger electron spectroscopy (AES), Focused ion beam scanning electron microscopy (FIB-SEM), four-point resistivity probe, and atomic force microscopy (AFM). The resulting findings, in terms of dependence of growth rate on substrate temperature, are plotted in FIG. 2. FIG. 2 exhibits the typical Arrhenius plot of ln(growth rate) as a function of inverse of substrate temperature in degrees Kelvin. The slope of the curve of ln(growth rate) vs. 1/T in the region where growth rate is a rapidly increasing function of substrate temperature (also known as kinetically controlled regime) yields the activation energy for the process.

However, in FIG. 2, no data points are plotted for temperatures below about 185° C. The reason for this is that during the experiment, no aluminum-copper films having a surface which was sufficiently smooth and void-free to be used in any meaningful analysis by RBS, AES, FIB-SEM, four-point resistivity probe, or AFM could be formed below about 185° C., and consequently, no growth rate data could be obtained. Thus, a CVD process for the preparation of aluminum-copper alloy films performed at temperatures above about 185° C. results in high-density, low-resistivity copper-doped aluminum films with small grain size and low surface roughness to be formed.

Figure 3:
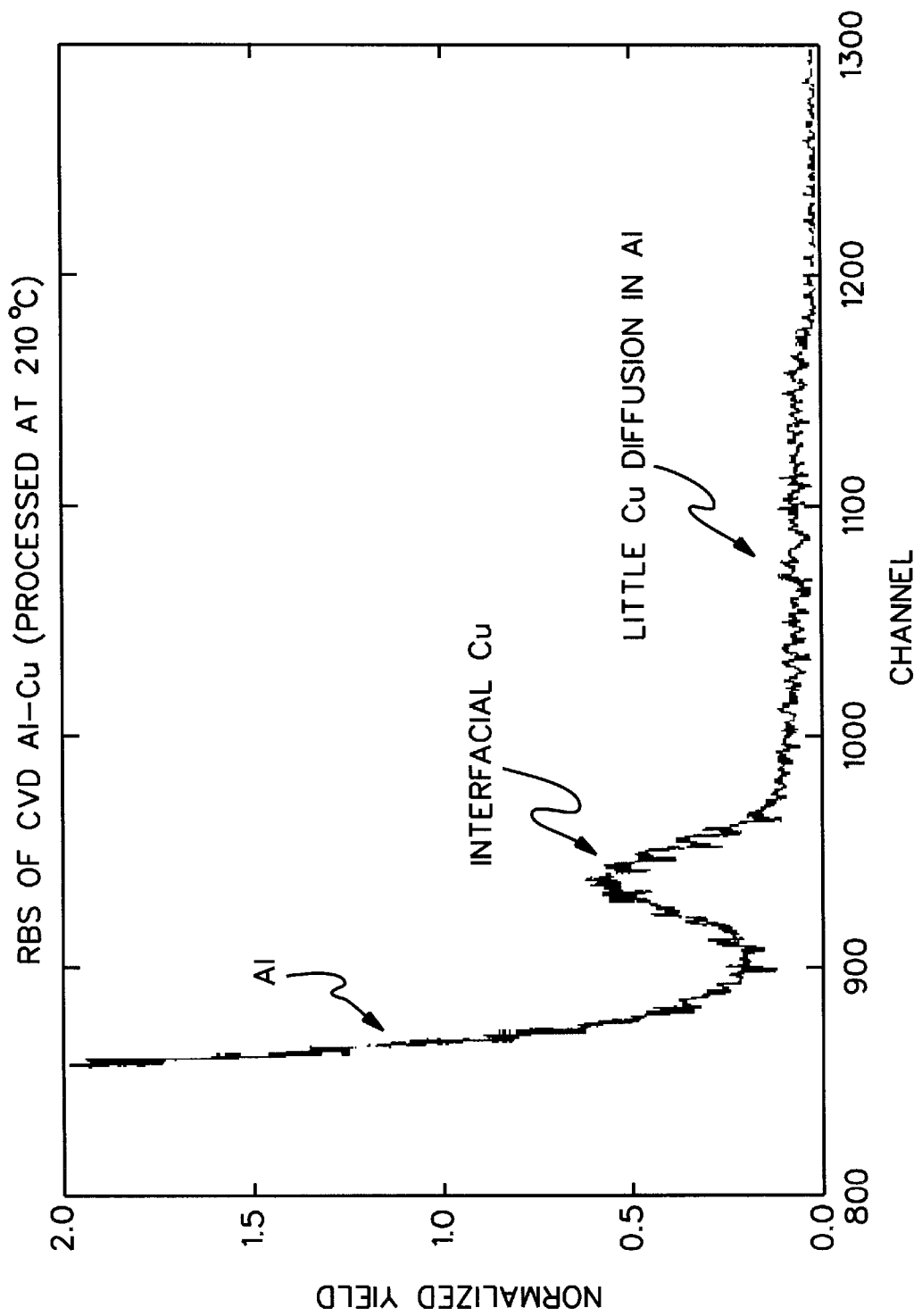
FIG. 3 is a Rutherford backscattering (RBS) spectrum of a bilayered stack consisting of a thermal CVD grown Al film deposited in-situ on a PACVD grown copper seed layer at a substrate temperature of 210° C. The data indicates that the aluminum film deposited at 210° C. contains a low concentration of copper dispersed in the film, and a much higher concentration at the interface. Given that the substrate temperature of 210° C. is close to the threshold temperature for the initiation of Al—Cu alloy formation, a significant fraction of the Cu seed has not yet reacted with the overlaying aluminum film. Clearly, a negligible amount of Cu atoms would be present within the Al matrix at lower temperatures.
Figure 4:
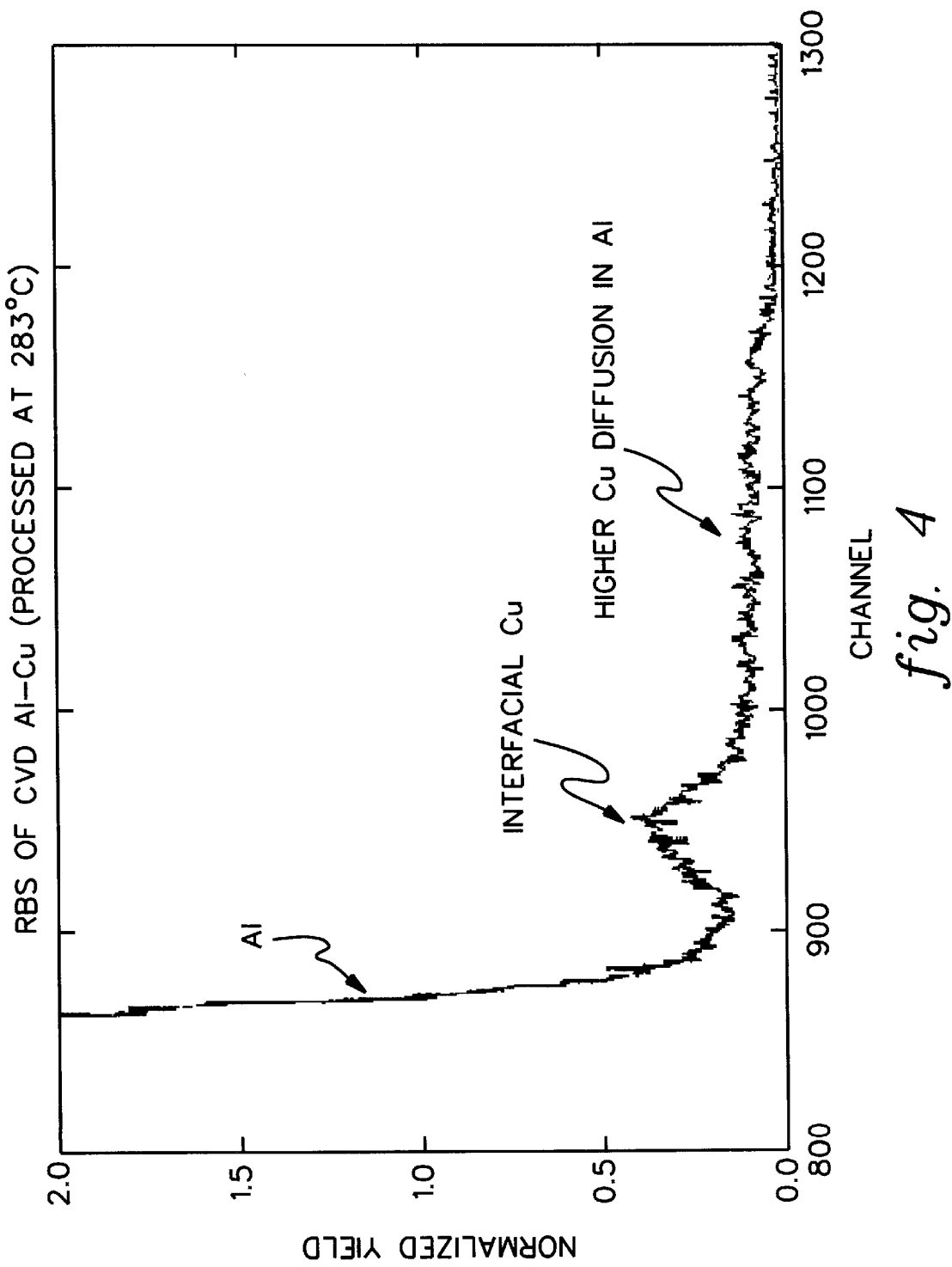
FIG. 4 is a Rutherford backscattering (RBS) spectrum of a bilayered stack consisting of a thermal CVD grown Al film deposited in-situ on a PACVD grown copper seed layer at a substrate temperature of 283° C. A comparison with the RBS spectrum of FIG. 3 shows that the concentration of copper at the Al—Cu interface decreases and the concentration of copper in the aluminum film increases, which indicates that the fraction of the Cu seed that has already diffused into the Al film is larger than that at the lower temperature of 210° C.
Figure 5:
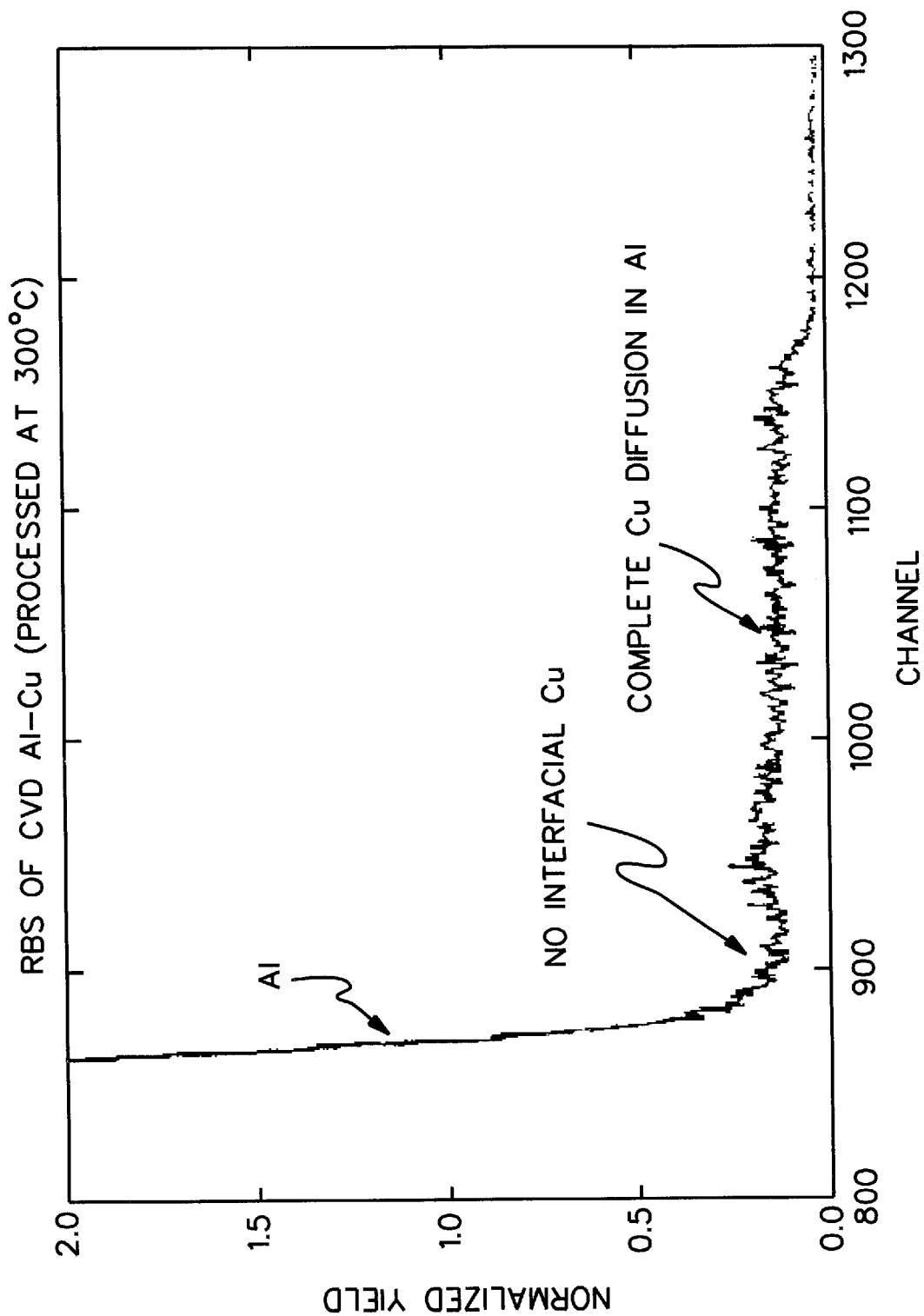
FIG. 5 is a Rutherford backscattering (RBS) spectrum of bilayered stack consisting of a thermal CVD grown Al film deposited in-situ on a PACVD grown copper seed layer at a substrate temperature of 300° C. A comparison with the RBS spectra of FIG. 3

Further, an examination of the copper diffusion profiles in CVD Al as a function of temperature in FIGS. 3–4 shows that at temperatures below about 185° C., there is no interaction between copper and aluminum. However, at temperatures above about 185° C., copper atoms begin to diffuse into the growing aluminum film. The presence of copper atoms in the growing aluminum film inhibits the formation of large grains and results in a film having a small grain size. FIGS. 3–5 show the effect of temperature on copper diffusion into an overlying aluminum film. In FIG. 3, RBS shows that an aluminum film deposited at 210° C. contained a low concentration of copper dispersed in the film, and a much higher concentration at the interface. This indicates that a significant fraction of the Cu seed had not yet reacted with the overlaying aluminum film, and that a negligible amount would be present at lower temperatures. In FIGS. 4 and 5, after the films were annealed at 283° C. and 300° C., respectively, the concentration of copper at the interface decreases and the concentration of copper in the aluminum film increases with temperature. As the processing temperature was increased to 283° C., a smaller Cu concentration was detected at the Al/substrate interface (FIG. 4), which indicates that the fraction of the Cu seed that has already diffused into the Al film is larger than that at the lower temperature of 210° C. Finally, complete Cu diffusion occurred at 300° C., as seen in FIG. 5, with no Cu seed remaining at the Al/substrate interface.

Both sets of experiments demonstrate that a temperature higher than 185° C. is required to form the CVD Al—Cu film and initiate interaction between the copper and aluminum while the Al film is growing.

Example 2

Preparation of Al Films Doped with 0.8 at % Cu Films

Plasma assisted chemical vapor deposition (PACVD) of copper was carried out with the reactor shown in FIG. 1, using copper N-N'-dimethyl diketenimidate as the copper source. The copper source precursor 10 was placed in the bubbler/sublimator 11 which was heated by a combination constant temperature bath and associated power supply 12 to temperatures between 100 and 150° C. during the CVD process. All transport and delivery lines and high vacuum isolation valves 18, 19, and 20 were maintained at temperatures in the range 100 to 150° C., using a combination heating tape and associated power supply 21 and 22, to prevent precursor recondensation.

The reactor was an 8" wafer, cold wall stainless steel CVD reactor. It was equipped with a parallel plate type plasma configuration made of two electrodes 26 and 27, with the reactor itself providing electrical grounding. The upper plate 26 served as the active electrode and was driven by the radio frequency (13.56 MHz) power supply 28. It was constructed in a "mesh" type pattern to allow unconstricted reactant flow to the substrate. A hydrogen plasma was used for in-situ pre-deposition substrate cleaning at plasma power densities in the range 0.05–0.25 W/cm$^2$, while a hydrogen plasma power density in the range 0.01 to 2.5 W/cm$^2$ was employed during actual deposition for PACVD copper. The substrate, which consisted of either unpatterned or patterned Si and $SiO_2$ and TiN coated Si and $SiO_2$ wafers, was placed on the lower electrode 27, which was not biased in this case, and was heated to processing temperatures in the range 100–250° C. by an aluminum-encapsulated resistive heater 30. The cone shaped shower head 20 was employed to ensure proper reactant mixing and uniformity in reactant delivery and flow over 8" wafers.

To guarantee process cleanliness, the reactor was periodically baked under a hydrogen atmosphere to below 0.2 Torr and then pumped down to below $10^{-7}$ Torr for an hour at 150° C. The pumping stack 32 consisted of two pumping packages, the first is turbomolecular pump based, and the second roots blower pump based, and was isolated from the reactor by the high vacuum gate valve. The turbomolecular pump based package was used to ensure high vacuum base pressure in the reactor, while the roots blower based package was employed for appropriate handling of the high gas throughput during actual CVD runs. A high vacuum load lock system was used for transport and loading of 8" wafers into the reactor. Finally, a side line 25 was employed to feed the hydrogen gas into the reactor. The $H_2$ flow of 100 to 1000 sccm was controlled by a mass flow controller 23 and associated isolation valve 24.

The copper deposition step was immediately followed in-situ with thermal CVD of aluminum using dimethylethyl aluminum alane (DMEAA) as the source precursor. The aluminum source precursor DMEAA 35 is placed in the reservoir (bubbler/sublimator) 36 in FIG. 1 which could be heated by a combination constant temperature oil bath and associated power supply 37 to a temperature in the range 20–60° C. during the CVD process. This temperature range was selected to ensure the vaporization of the aluminum source, while avoiding its premature decomposition. An MKS Model 1150 hot source mass flow controller 41 was used to control the flow of precursor, which ranged from 0.5 to 10 sccm, into the CVD system through inlet 40. The aluminum delivery system could be isolated from the precursor reservoir by a high vacuum valve 42. All transport and delivery lines and high vacuum isolation valves 40, 41 and 42, were maintained at the aluminum precursor vaporization temperature (20–60° C.), using a typical combination of resistance heating tape and associated power supply 43, to prevent precursor recondensation. The aluminum film was grown in-situ on the top of the copper seed layer at substrate temperature of 185° C., hydrogen reactant flow of 100–1000 sccm, and reactor working pressure of 100–2000 mtorr. After the aluminum deposition step was completed, ex-situ annealing of the Al/Cu bilayer was performed for 100 minutes at 450° C. in a hydrogen ambient at a working pressure of 1 atmosphere.

The Cu doped Al films thus produced were metallic, continuous, and silver colored. Their structural and electrical properties as well as chemical composition, were thoroughly analyzed by x-ray diffraction (XRD), Auger electron spectroscopy (AES), x-ray photoelectron spectroscopy (XPS), Rutherford backscattering (RBS), four point resistivity probe, and cross-sectional SEM (CS-SEM).

Figure 6:
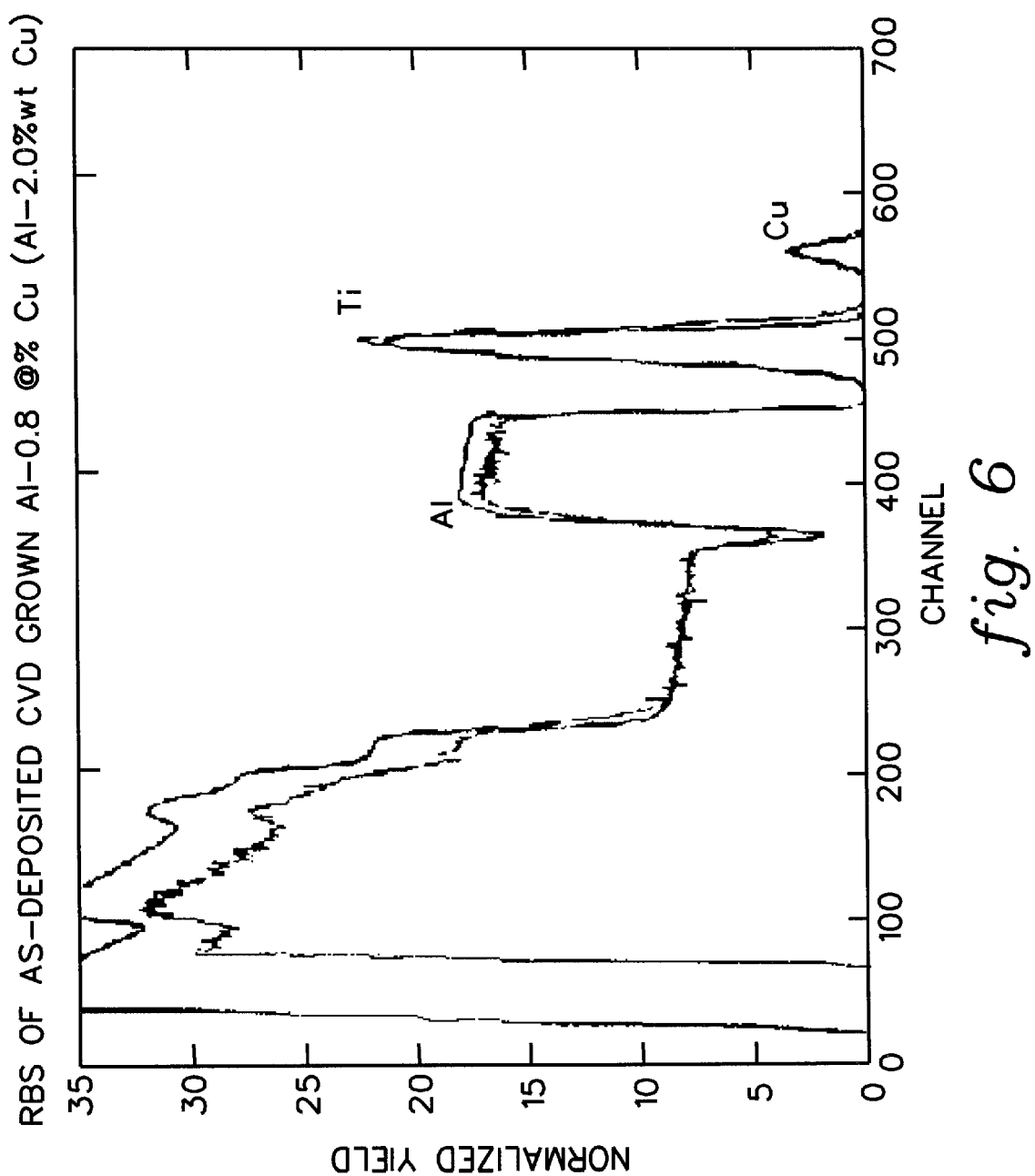
FIG. 6 is a Rutherford backscattering (RBS) spectrum of a bilayered stack consisting of a thermal CVD grown, 380 nm-thick, Al film deposited in-situ on a PACVD grown copper seed layer at a substrate temperature of 185° C. The data indicates that the aluminum film deposited at 185° C. contains a low concentration of copper dispersed in the film, and a much higher concentration at the interface. Given that the substrate temperature of 185° C. is the threshold temperature for the initiation of Al—Cu alloy formation, a significant fraction of the Cu seed has not yet reacted with the overlaying aluminum film, even though Cu diffusion has been initiated.

The pre-annealed films consisted mainly of a bilayer, 3800 Å thick, Al film with 5 at % Cu primarily located at the aluminum-substrate interface, as shown in FIG. 6. The data indicated that the aluminum film deposited at 185° C. contained a low concentration of copper dispersed in the film, and a much higher concentration at the interface. Given that the substrate temperature of 185° C. is the threshold temperature for the initiation of Al—Cu alloy formation, a significant fraction of the Cu seed has not yet reacted with the overlaying aluminum film, even though Cu diffusion has been initiated.

Figure 7:
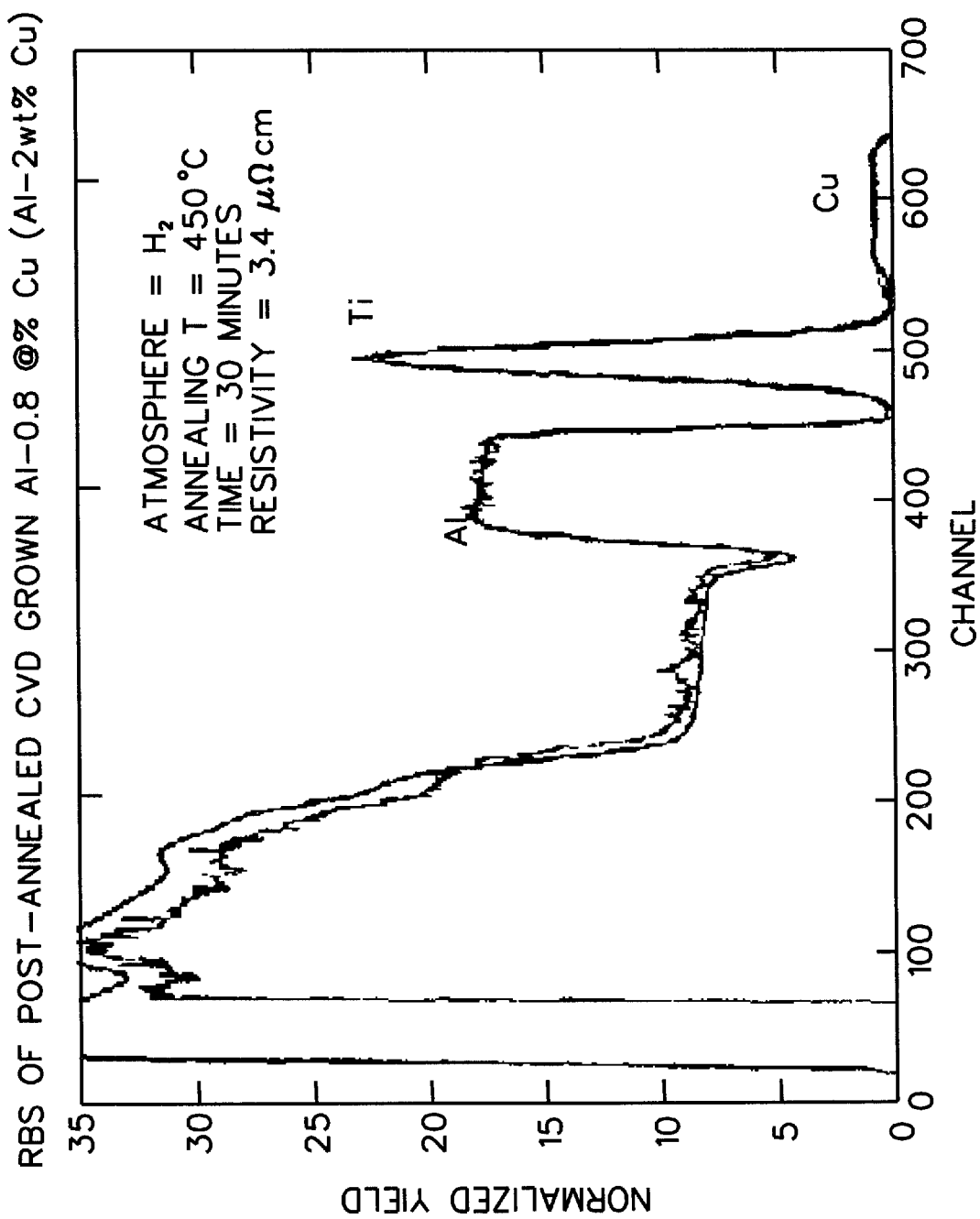
FIG. 7 is a Rutherford backscattering (RBS) spectrum of the same sample shown in FIG. 6 after annealing for 100 minutes at 450° C. in one atmosphere of hydrogen. The RBS spectrum indicates an Al phase doped with 0.8 at %Cu (Al—2.0 wt % Cu), with the copper being distributed uniformly throughout the Al matrix. No impurities or contaminants, such as oxygen, carbon, or fluorine were observed in the doped aluminum film.
Figure 8:
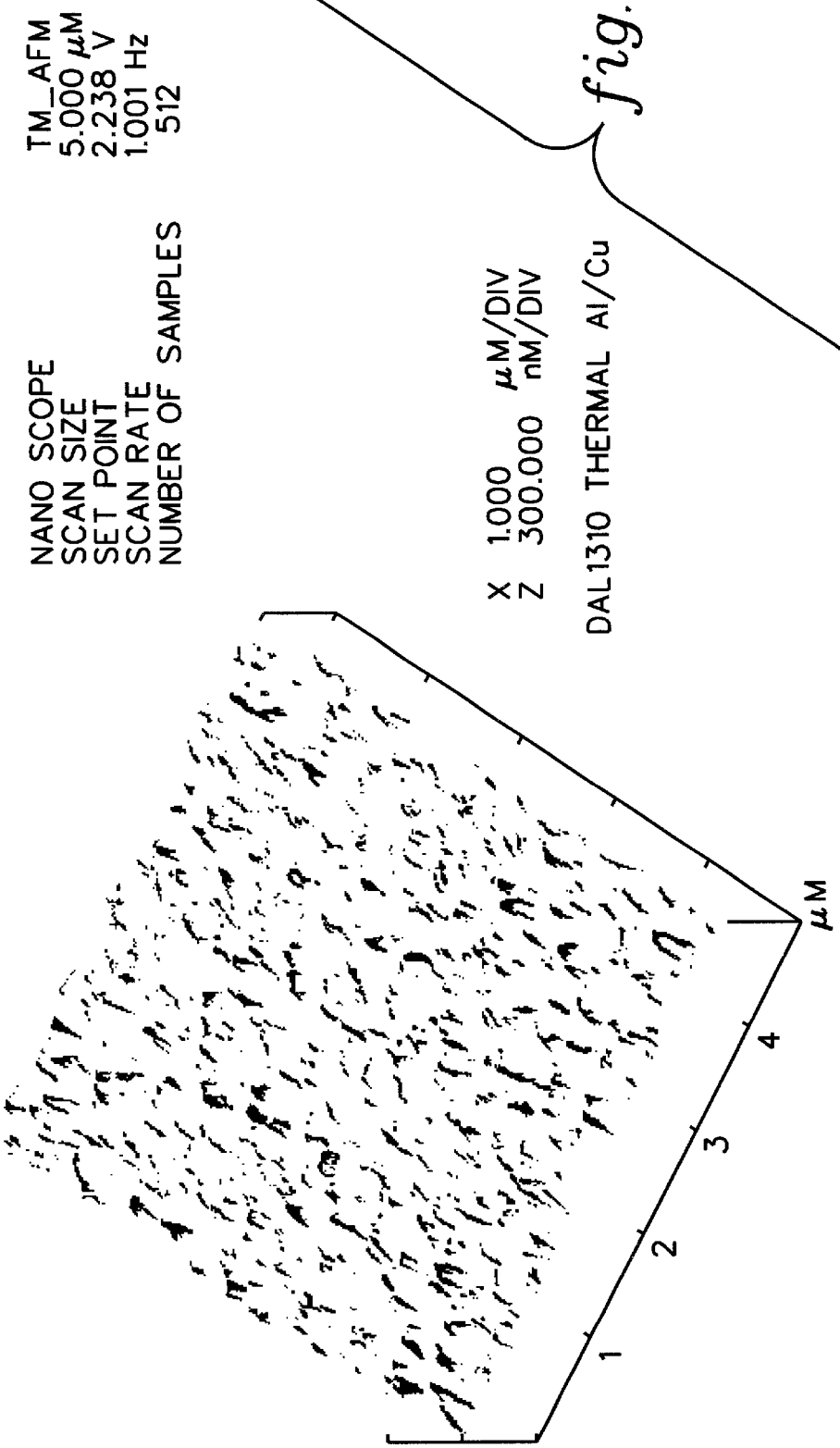
FIG. 8 is an atomic force microscopy (AFM) micrograph of a 3800 Å-thick copper-doped aluminum film grown according to the process of the present invention. AFM indicates a smooth surface morphology with small aluminum grains.
Figure 9:
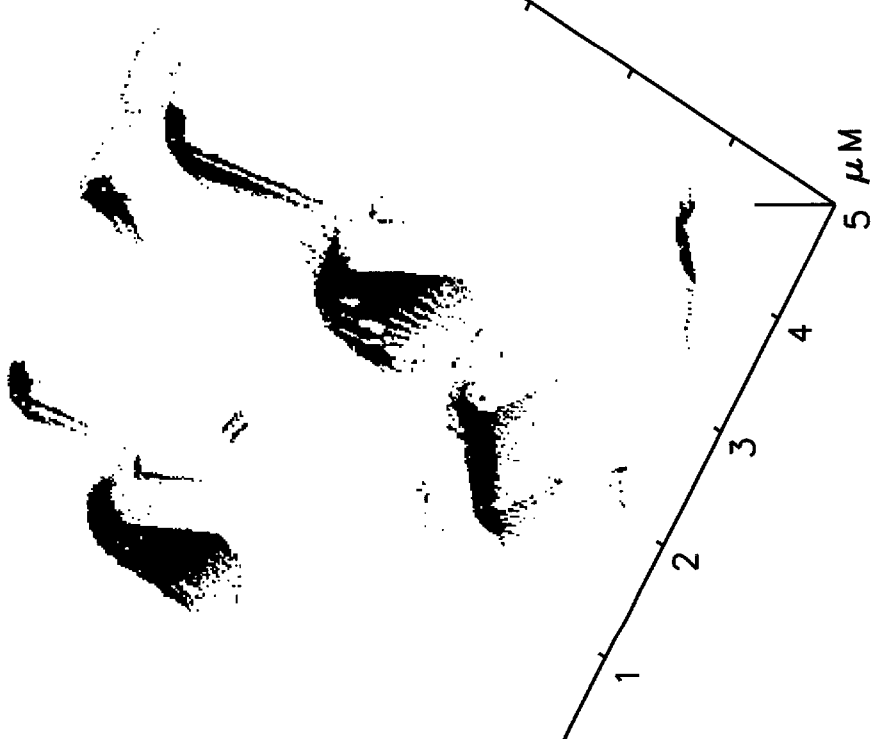
FIG. 9 is an atomic force microscopy (AFM) micrograph of a 7200 Å-thick aluminum film grown by thermal CVD without a copper seed layer. AFM indicates a very rough surface morphology with extremely large, void-containing, aluminum grains.

After annealing, the film consisted of an Al—0.8 at % Cu phase, with the copper being uniformly distributed across the aluminum matrix, as documented by the RBS data shown in FIG. 7. An Atomic force microscopy scan of the surface of the 3800 Å-thick copper-doped aluminum film indicates a smooth surface morphology with small aluminum grains, as shown in FIG. 8. This is in contrast to the surface morphology of a 7200 Å-thick aluminum film grown by thermal CVD without a copper seed layer, as displayed in FIG. 9, where AFM shows a rough surface morphology with extremely large aluminum grains. A four point probe resistivity measurements showed an after annealing resistivity for the Cu doped Al film of 3.49 $\mu$Wcm.

Example 3

Preparation of Al Films Doped with 3 at % Cu Films

In situ, sequential, plasma assisted chemical vapor deposition (PACVD) of copper followed by thermal CVD of aluminum was carried out with the reactor shown in FIG. 1, using the same source precursors and run conditions used for Example 2, except for run time. Longer copper and aluminum deposition times (14 minutes for Cu, 20 minutes for Al) were implemented to grow thicker aluminum films with higher Cu dopant concentration.

The Cu doped Al films thus produced were metallic, continuous, and silver colored. Their structural and electrical properties as well as chemical composition, were thoroughly analyzed by x-ray diffraction (XRD), Auger electron spectroscopy (AES), x-ray photoelectron spectroscopy (XPS), Rutherford backscattering (RBS), four point resistivity probe, and cross-sectional SEM (CS-SEM). The pre-annealed films consisted of a bilayer, 8000 Å thick, Al film with 20 at % Cu primarily located at the aluminum-substrate interface. Again, the data indicated that the aluminum film deposited at 185° C. contained a low concentration of copper dispersed in the film, and a much higher concentration at the interface. Given that the substrate temperature of 185° C. is the threshold temperature for the initiation of Al—Cu alloy formation, a significant fraction of the Cu seed has not yet reacted with the overlaying aluminum film, even though Cu diffusion has been initiated.

Figure 10:
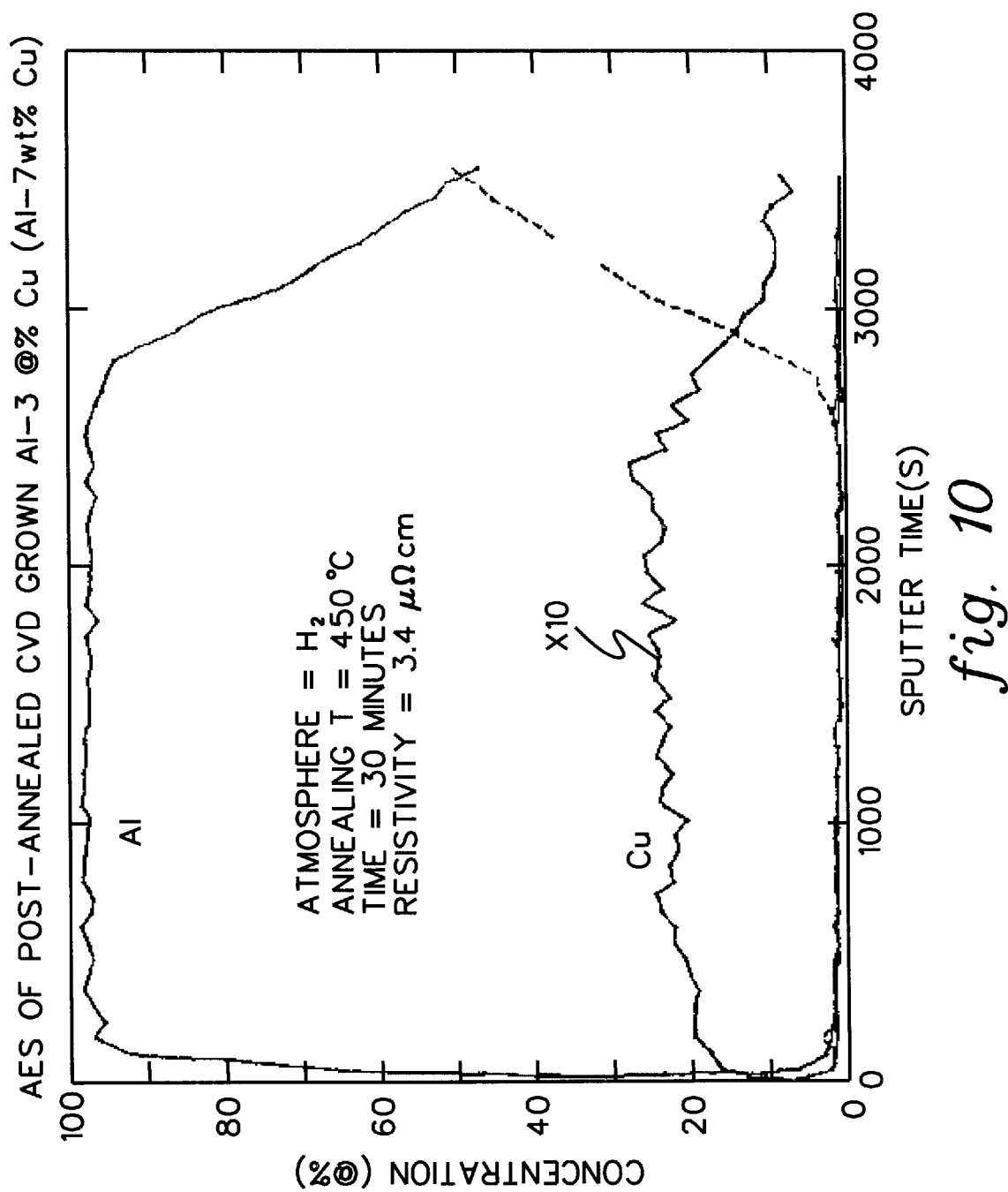
FIG. 10 is an Auger electron spectroscopy (AES) spectrum of an Al—Cu stack after annealing for 100 minutes at 450° C. in one atmosphere of hydrogen. Before annealing, the stack consisted of a thermal CVD grown, 8000 Å-thick, Al film deposited in-situ on a PACVD grown copper seed layer. After annealing, the RBS spectrum indicates an Al phase doped with 3 at % Cu (Al—7.5 wt % Cu), with the copper being distributed uniformly throughout the Al matrix. No impurities or contaminants, such as oxygen, carbon, or fluorine were observed in the doped aluminum film.
Figure 11:
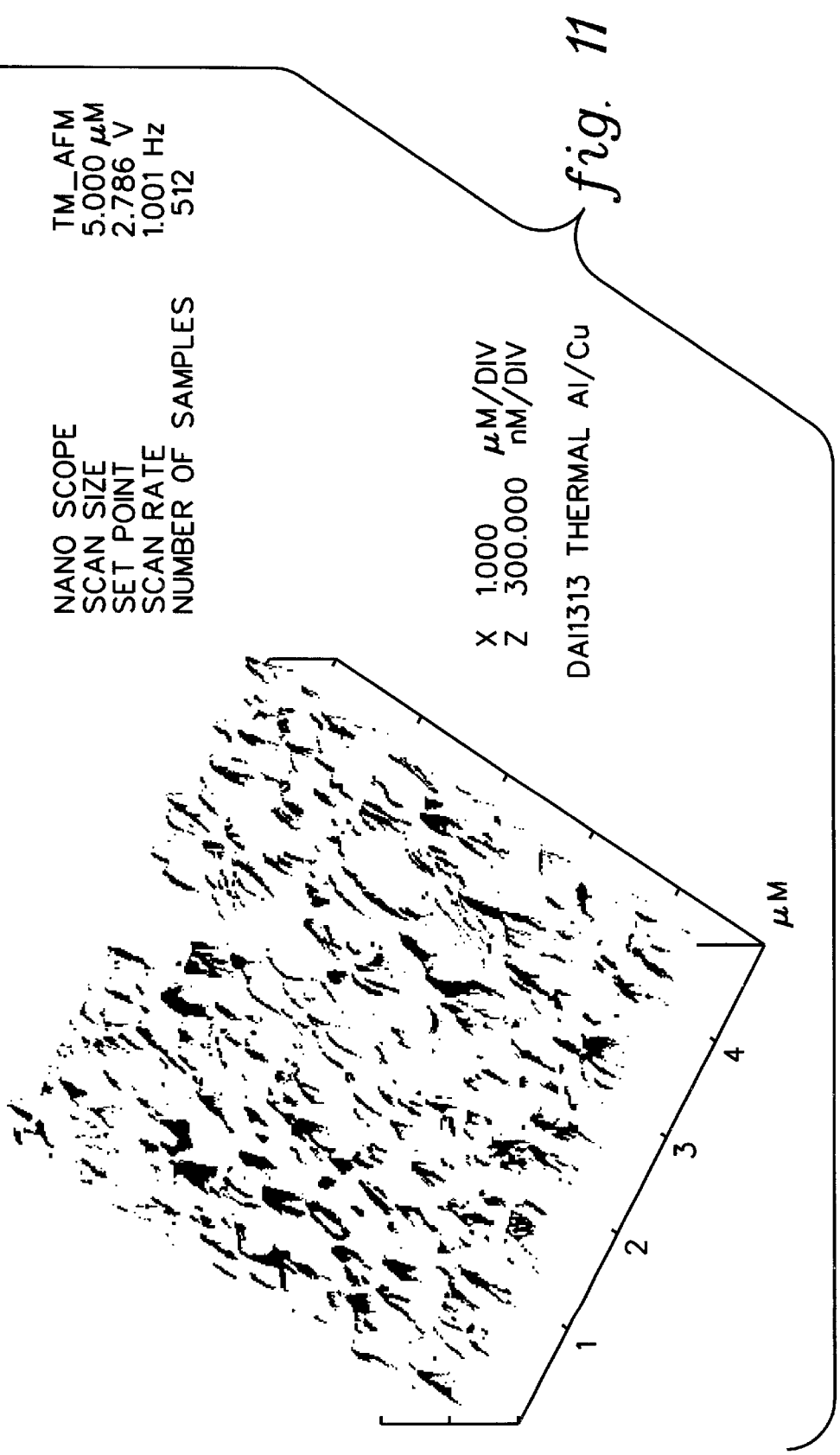
FIG. 11 is an atomic force microscopy (AFM) micrograph of an 8000 Å-thick copper-doped aluminum film grown according to the process of the present invention. AFM indicates a smooth surface morphology with small aluminum grains.

After annealing, the film consisted of an Al—3 at % Cu phase, with the copper being uniformly distributed across the aluminum matrix, as documented by the AES data shown in FIG. 10. An Atomic force microscopy scan of the surface of the 8000 Å-thick copper-doped aluminum film indicates a smooth surface morphology with small aluminum grains, as shown in FIG. 11. This is in contrast to the surface morphology of a 7200 Å-thick aluminum film grown by thermal CVD without a copper seed layer, as displayed in FIG. 5, where AFM shows a rough surface morphology with extremely large aluminum grains. This example illustrates the role of the copper seed layer in ensuring the formation of thick aluminum films (>5000 Å) with the proper morphology and surface texture for advanced microelectronics applications. Four point probe resistivity measurements showed an after annealing resistivity for the Al—Cu phase of 3.37 $\mu$Wcm.

For illustration purposes, selected results from the two samples discussed above are summarized in the Table 1 above. In particular, the AFM grain size data shown in the Table.

purpose was to demonstrate the applicability of the present invention to the plasma-assisted growth of sequential Al—Cu—Al layers, with and without substrate bias. The first 1000 Å thick aluminum layer was deposited by plasma assisted chemical vapor deposition (PACVD) in the reactor shown in FIG. 1, using DMEAA as the aluminum source. In this case, the aluminum precursor and hydrogen reactant gaseous flows were set at, respectively, 10 sccm and 1000 sccm. The substrate temperature, plasma power, and reactor working pressure were respectively, 185°, 0.15 torr, and 3 watts, with a bias of 150 kHz and 5 W being applied to the substrate to ensure conformal Al deposition in aggressive patterned structures, such as 0.25 $\mu$m, 4:1, aspect ratio vias and trenches of semiconductor substrates.

After the first Al deposition step, the reactor was pumped down below $10^{-7}$ torr to ensure complete removal for any aluminum precursor species. This was followed by in-situ PACVD growth of an ultrathin copper layer on top of the first Al film using the Cu precursor copper bis-hexafluoroacetylacetonate, $Cu(II)(hfac)_2$. Again, the Cu(II) $(hfac)_2$ source precursor 10 was placed in the bubbler/sublimator 11 which was heated by a combination constant temperature bath and associated power supply 12 to temperatures between 50 and 100° C. during the CVD process. All transport and delivery lines and high vacuum isolation valves 18, 19, and 20 were maintained at temperatures in the range 50 to 100° C., using a combination heating tape and associated power supply 21 and 22, to prevent precursor recondensation. A hydrogen carrier gas flow of 25 sccm was employed to control precursor delivery into the CVD reactor. In this case, the hydrogen reactant gaseous flow was set at 1000 sccm. The substrate temperature, plasma power, and reactor working pressure were, respectively, 185° C., 0.5 torr, and 30 watts, with no substrate bias.

After the Cu deposition, the reactor was again pumped down below $10^{-7}$ torr to ensure complete removal for any

TABLE 1

Summary of Results from Examples 2 and 3

| Sample | Thickness (Å) | Cu Concentration (at %) | | Resistivity ($\mu$Wcm) | | Grain Size ($10^4$ nm$^2$) |
|---|---|---|---|---|---|---|
| | | Pre-Anneal | Post-Anneal | Pre-Anneal | Post-Anneal | |
| Sample in Example 2 | 3800 | Al-5 at % Cu @ interface. Low Cu concentration dispersed in Al film | 0.8 through Film | 3.3 | 3.49 | 1.6 |
| Sample in Example 3 | 8000 | Al-20 at % Cu @ interface. Low Cu concentration dispersed in Al film | 3.0 through Film | 3.56 | 3.37 | 1.8 |
| Standard thermal CVD Al | 7200 | 0 at % | 0 at % | — | — | 100 |

Table 1 demonstrates the role of the copper seed layer in forming an Al—Cu phase with smooth surface morphology and corresponding small grain size (more than 50 times smaller than an aluminum film of comparable thickness grown by conventional thermal CVD Al without Cu seed layer).

Example 4

Preparation of Al Films Doped with 0.1 at % Cu Films

In this case, the present invention was applied to grow and anneal PACVD deposited Al—Cu—Al trilayer stacks. The copper precursor species. This step was immediately followed in-situ with PACVD of aluminum from DMEAA under the same process parameter used for the first PACVD Al deposition. After the second aluminum deposition step was completed, in-situ annealing of the AlCu/Al trilayer was performed for 60 minutes at 450° C. in a hydrogen ambient at a working pressure of 0.5 torr.

Figure 12:
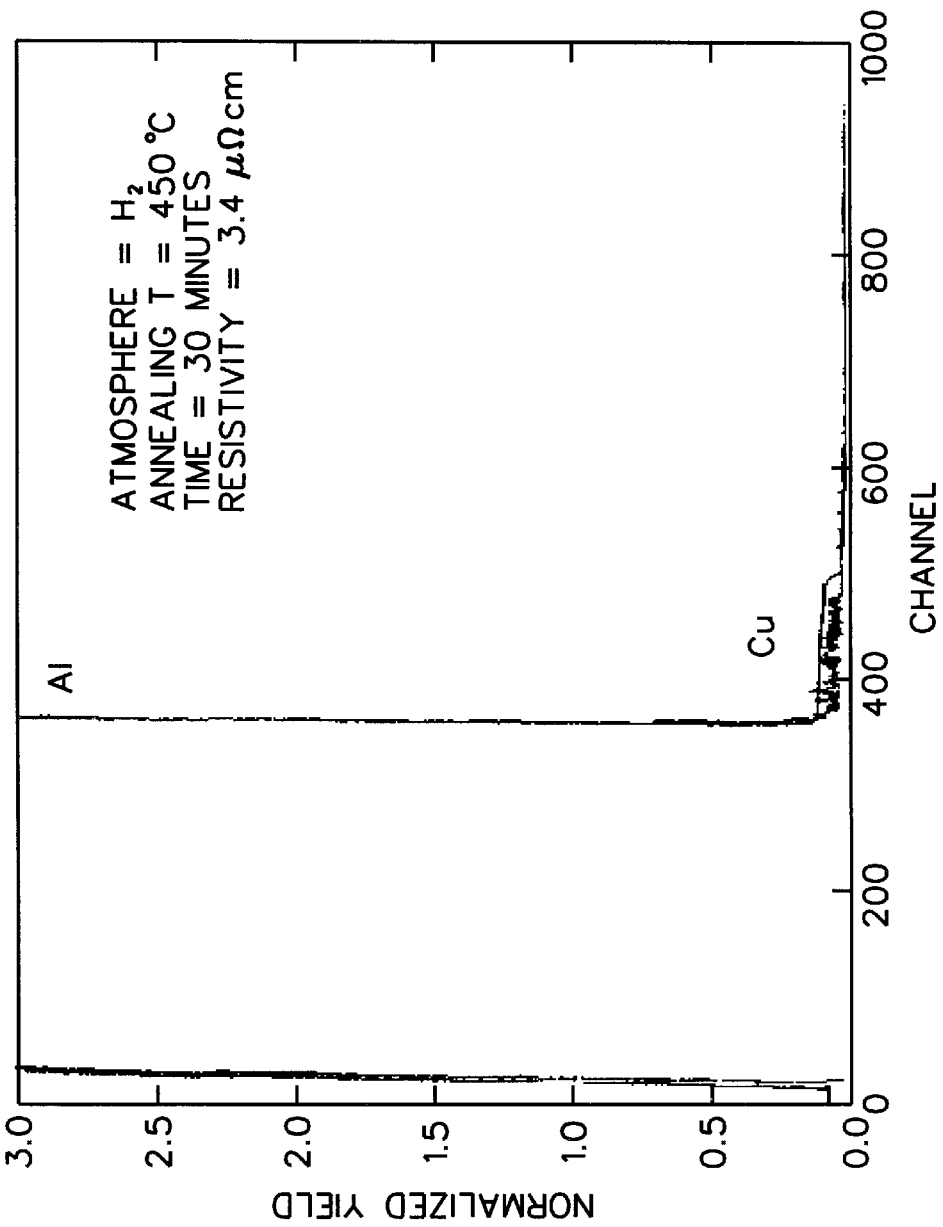
FIG. 12 is a Rutherford backscattering (RBS) spectrum of an Al—Cu stack after annealing for 100 minutes at 450° C. in one atmosphere of hydrogen. Before annealing, the stack consisted of PACVD deposited Al—Cu—Al trilayer stack. After annealing, the RBS spectrum indicates an Al phase doped with 0.1 at % Cu (Al—2.5 wt % Cu), with the copper being distributed uniformly throughout the Al matrix. No impurities or contaminants, such as oxygen, carbon, or fluorine were observed in the doped aluminum film.

The Cu doped Al films thus produced were metallic, continuous, and silver colored. Their structural and electrical properties as well as chemical composition, were thoroughly analyzed by x-ray diffraction (XRD), Auger electron spectroscopy (AES), x-ray photoelectron spectroscopy (XPS), Rutherford backscattering (RBS), four point resistivity probe, and cross-sectional SEM (CS-SEM). After annealing, the film consisted of an Al—0.1 at % Cu phase, with the copper being uniformly distributed across the aluminum matrix, as documented by the RBS data shown in FIG. 12.

Example 5

Preparation of Cu Doped Al Films Using Different Al Precursor Flows

In this case, in situ, sequential, plasma assisted chemical vapor deposition (PACVD) of copper followed by thermal CVD of aluminum was carried out with the reactor shown in FIG. 1, using the same source precursors and run conditions used for Example 1, except for aluminum precursor gaseous flow. Two different aluminum precursor flows, namely 5 sccm and 15 sccm, were employed to demonstrate that the application of an ultrathin (<100 Å) copper layer as a seed layer in the deposition of smooth, copper-doped, aluminum films with the texture and morphology needed for advanced microelectronics applications is independent of aluminum precursor flow and associated nucleation mechanisms and film thickness. For these runs, specialized semiconductor cantilever structures, which consisted of silicon substrates upon which "overhang" silicon oxide patterns were formed, were also employed to examine film step coverage and conformality.

The Cu doped Al films thus produced were metallic, continuous, and silver colored. Their structural and electrical properties as well as chemical composition, were thoroughly analyzed by x-ray diffraction (XRD), Auger electron spectroscopy (AES), x-ray photoelectron spectroscopy (XPS), Rutherford backscattering (RBS), four point resistivity probe, and cross-sectional SEM (CS-SEM).

Figure 13:
FIG. 13 depicts cross sections, magnified by scanning electron microscopy, of semiconductor cantilever structures consisting of silicon substrates upon which "overhang" silicon oxide patterns are formed and upon which copper and aluminum layers were deposited by CVD and PACVD.
Figure 13:

FIG. 13 depicts cross sections, magnified by scanning electron microscopy, of the semiconductor cantilever structures after copper and aluminum deposition. In FIG. 13(a), aluminum was deposited directly on the overhang structure by conventional thermal CVD without using the copper seed layer. In FIG. 13(b), the present invention was applied to grow an Al—Cu stack consisting of approximately 7500 Å-thick Al film on an ultrathin copper seed layer. Aluminum precursor flow was 5 sccm in both cases. A comparison of the two cross sections demonstrates how the ultrathin copper seed layer inhibits undesirable large aluminum grain growth, yielding the texture and composition required for microelectronics applications.

Figure 14:
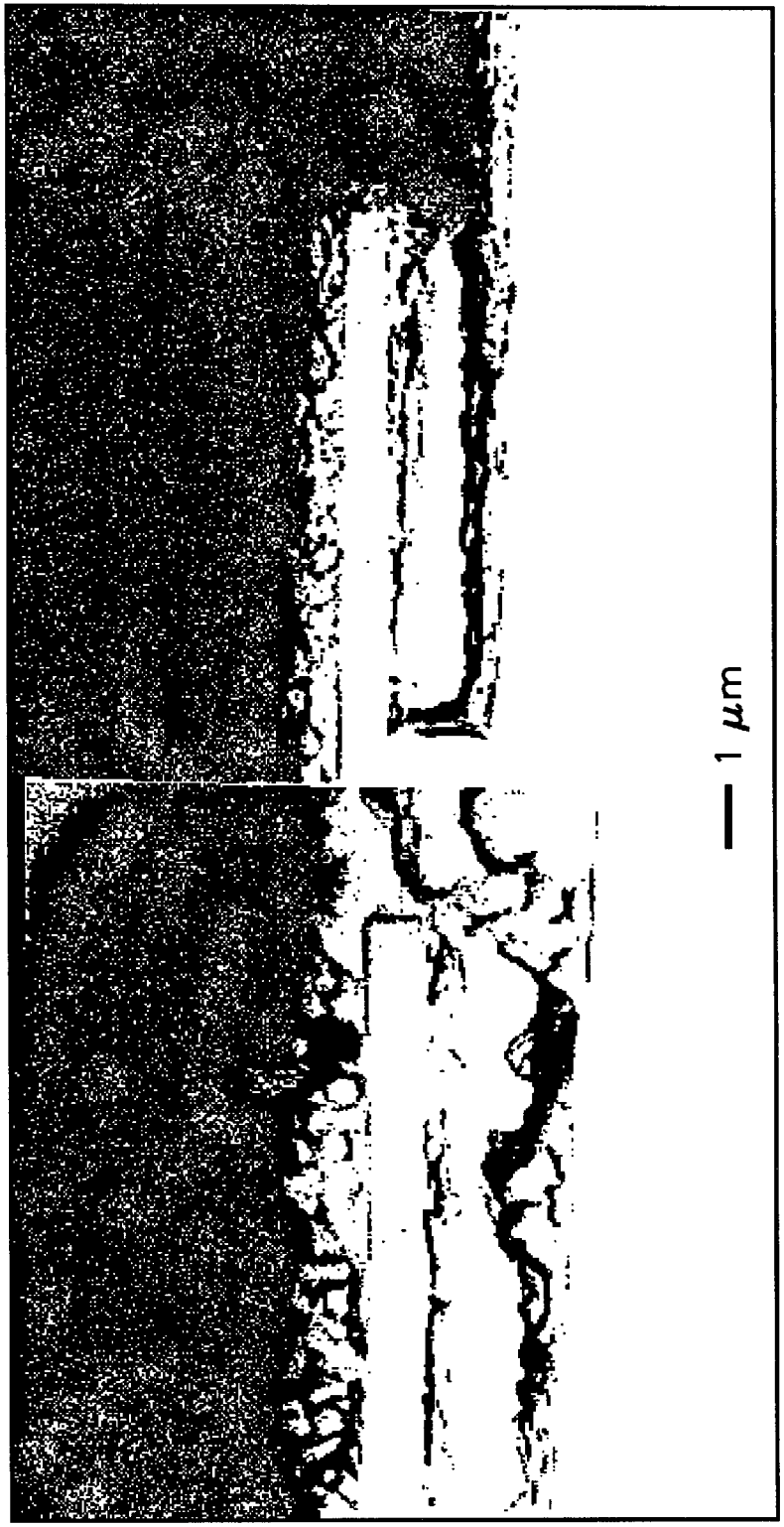
FIG. 14 depicts cross sections, magnified by scanning electron microscopy, of cantilever structures similar to the ones shown in FIG. 13. Copper and aluminum layers were deposited on these structures by CVD and PACVD under conditions identical to those used for FIG. 13, except for aluminum precursor flow which was three times higher in this case.

FIG. 14 also depicts cross sections, magnified by scanning electron microscopy, of the semiconductor cantilever structures after copper and aluminum deposition. In FIG. 14(a), aluminum was deposited directly on the overhang structure by conventional thermal CVD without using the copper seed layer. In FIG. 14(b), the present invention was applied to grow an Al—Cu stack consisting of approximately 1 µm-thick Al film on an ultrathin copper seed layer. Aluminum precursor flow was 15 sccm in both cases. A comparison of the two cross sections demonstrates how the ultrathin copper seed layer inhibits undesirable large aluminum grain growth, yielding the texture and composition required for microelectronics applications.

Example 6

Preparation of Ultrathin Cu Layers with Reproducible Thickness

In this case, the present invention was applied to demonstrate the reproducible growth of ultrathin copper layers (<100 Å) through the use of mixtures of copper source precursors which have been diluted in a precursor carrier medium at significantly reduced precursor concentration levels. Accordingly, plasma assisted chemical vapor deposition (PACVD) of copper was carried out with the reactor shown in FIG. 1, using the precursor copper bis-hexafluoroacetylacetonate, $Cu(II)(hfac)_2$ as the copper source. The copper source precursor 10 was dissolved in an appropriate liquid medium, 2-propanol (or isopropanol, IPA) in this case, at a concentration of 10 grams of Cu precursor for 100 ml of IPA. The resulting liquid mixture was placed in a reservoir 11. A mass flow controller 38, which can be isolated from the reservoir by a high vacuum valve 39, is used to control the flow of gas (argon in this case) into the reservoir through inlet 40. This gas served as a pressurizing agent for the liquid mixture. An MKS (Andover, Mass.) liquid delivery system 41, consisting of a combination micropump and vaporizer head was applied to the delivery of the liquid (precursor+medium) at a rate of 0.4 cc/min to the CVD reactor 17. All transport and delivery lines and high vacuum isolation valves 18, 19, and 20 were maintained at temperatures in the range 50 to 100° C., using a combination heating tape and associated power supply 21 and 22, to prevent precursor recondensation.

The reactor was an 8" wafer, cold wall stainless steel CVD reactor. It was equipped with a parallel plate type plasma configuration made of two electrodes 26 and 27, with the reactor itself providing electrical grounding. The upper plate 26 served as the active electrode and was driven by the radio frequency (13.56 MHz) power supply 28. It was constructed in a "mesh" type pattern to allow unconstricted reactant flow to the substrate. A hydrogen plasma was used for in-situ pre-deposition substrate cleaning at plasma power densities in the range 0.05–0.25 W/cm$^2$, while a hydrogen plasma power density in the range 0.01 to 2.5 W/cm$^2$ was employed during actual deposition for PACVD copper. The substrate, which consisted of either unpatterned or patterned Si and $SiO_2$ and TiN coated Si and $SiO_2$ wafers, was placed on the lower electrode 27, which was not biased in this case, and was heated to processing temperatures in the range 100–250° C. by an aluminum-encapsulated resistive heater 30. The cone shaped shower head 20 was employed to ensure proper reactant mixing and uniformity in reactant delivery and flow over 8" wafers.

To guarantee process cleanliness, the reactor was periodically baked under a hydrogen atmosphere to below 0.2 Torr and then pumped down to below $10^{-7}$ Torr for an hour at 150° C. The pumping stack 32 consisted of two pumping packages, the first is turbomolecular pump based, and the second roots blower pump based, and was isolated from the reactor by the high vacuum gate valve. The turbomolecular pump based package was used to ensure high vacuum base pressure in the reactor, while the roots blower based package was employed for appropriate handling of the high gas throughput during actual CVD runs. A high vacuum load lock system was used for transport and loading of 8" wafers into the reactor. Finally, a side line 25 was employed to feed the hydrogen gas into the reactor. The $H_2$ flow of 100 to 1000 sccm was controlled by a mass flow controller 23 and associated isolation valve 24.

Figure 15:
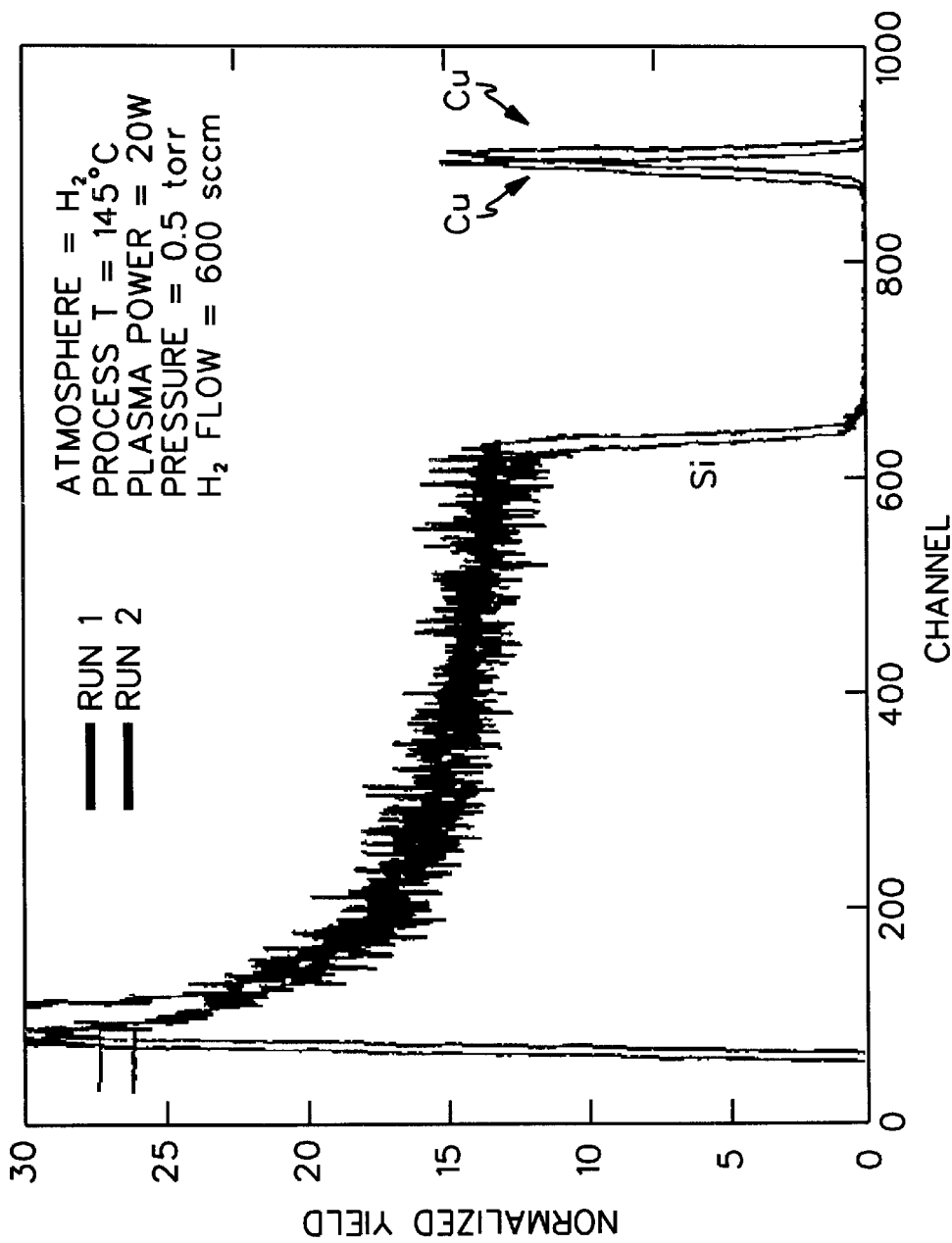
FIG. 15 is a plot of the RBS spectra of two ultrathin Cu layers grown by PACVD on Si substrates using the delivery approach of the present invention. The RBS data shows a highly repeatable Cu thickness of 80 Å.
Figure 16:
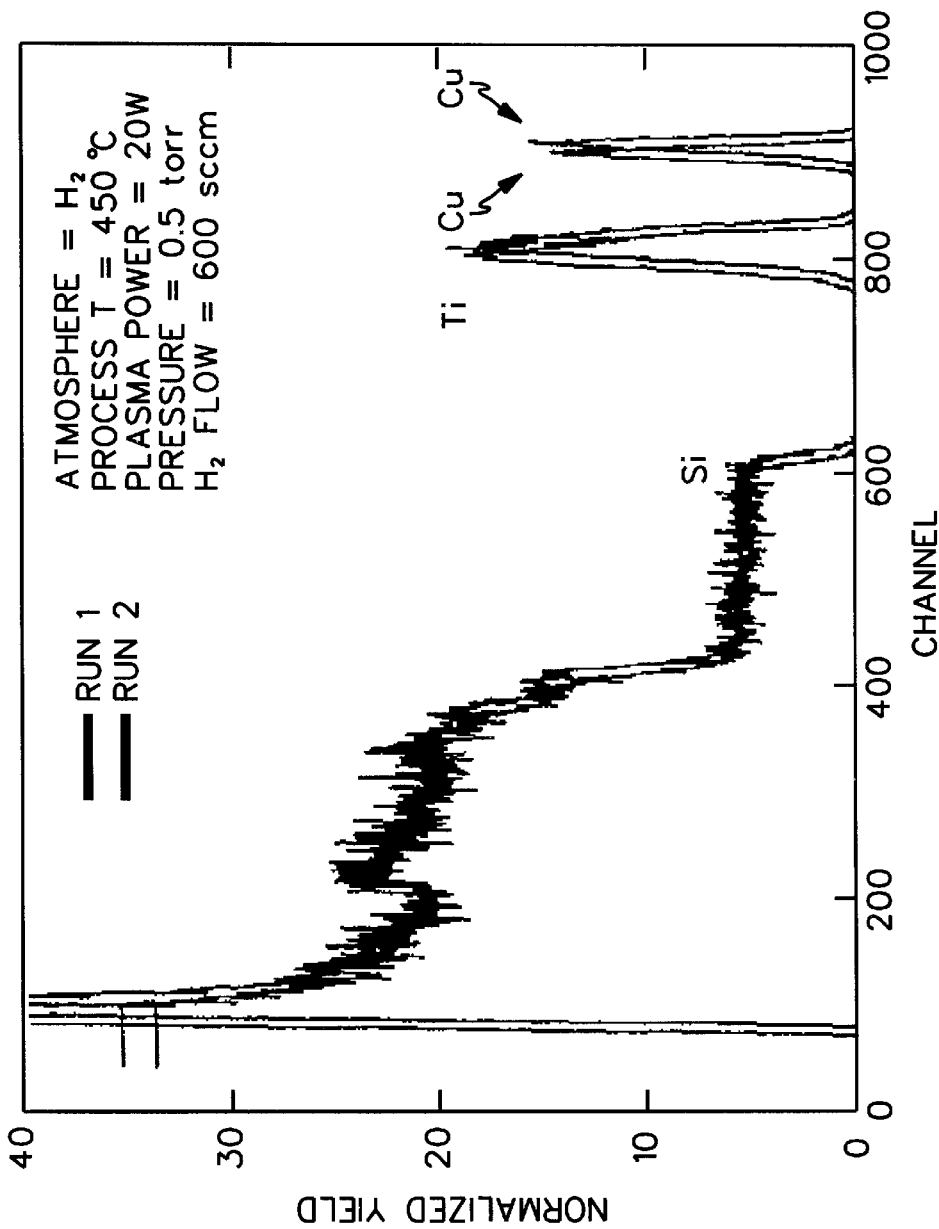
FIG. 16 is a plot of the RBS spectra of two ultrathin (80 Å) Cu layers grown by PACVD on TiN substrates using the delivery approach of the present invention. The RBS data shows a highly repeatable Cu thickness of 80 Å.

The Cu ultrathin layers thus produced were metallic, continuous, and copper colored. Their structural and electrical properties as well as chemical composition, were thoroughly analyzed by x-ray diffraction (XRD), Auger electron spectroscopy (AES), x-ray photoelectron spectroscopy (XPS), Rutherford backscattering (RBS), four point resistivity probe, and cross-sectional SEM (CS-SEM). In particular, RBS analysis showed a highly repeatable thickness of 80 Å in all 10 reproducibility runs, regardless of the substrate used. This result is documented in FIG. 15 and FIG. 16 which compare the thickness of the Cu ultrathin layer for two sets of runs performed on Si (FIG. 15) and TiN (FIG. 16). All four samples exhibit a thickness of 80 Å.

What is claimed is:

1. A chemical vapor deposition process for the in-situ preparation of conformal copper-doped aluminum coatings on a substrate in a chemical vapor deposition (CVD) reactor comprising:
   a. generating a first flow of a first reactant vapor directed to said substrate in said reactor, said first reactant vapor comprising a copper source precursor;
   b. heating said substrate to a temperature sufficient to decompose said first reactant vapor and form, directly on a surface of the substrate, a copper layer having a thickness of less than 10 nm;
   c. generating a second flow of a second reactant vapor directed to said substrate in said reactor, said second reactant vapor consisting of an aluminum source precursor, and optionally, a carrier gas;
   d. heating said substrate to a temperature higher than 185° C. to decompose said second reactant vapor and form a copper-doped aluminum film.

2. The method of claim 1 wherein said first flow of reactant vapor is generated by vaporizing a mixture of copper source precursor and a precursor diluting agent.

3. The method of claim 2 wherein said precursor diluting agent comprises a liquid medium selected from the group consisting of alcohols, ethanol, methanol, 2-propanol, acetone, hexane, toluene, water, amines, and halides.

4. The method of claim 2 wherein said precursor diluting agent comprises a gaseous medium selected from the group consisting of inert gases, hydrogen, amines, ammonia, water vapor, carbon monoxide, carbon dioxide, and nitrous oxide.

5. The method of claim 2 wherein the concentration of said copper source precursor in said first flow of reactant vapor ranges from 0.001 wt % to 50 wt %.

6. The method of claim 1 wherein said first reactant vapor additionally comprises a gas selected from the group consisting of hydrogen, water vapor, alcohols, helium, argon, xenon, and nitrogen.

7. The method of claim 1 further comprising applying an electrical bias to the substrate.

8. The method of claim 7 wherein the electrical bias on the substrate is selected from the group consisting of direct current (dc), radio frequency of less than 500 kHz, radio frequency from 500 kHz to $10^6$ kHz, and microwave frequency.

9. The method of claim 8 wherein said radio frequency or microwave electrical bias is with electrical power in the range 0.005 Watts/cm$^2$ to 100 Watts/cm$^2$.

10. The method of claim 7 further comprising the steps of generating a plasma in the reactor.

11. The method of claim 1 comprising the further step of generating a plasma of at least one of said first reactant gas and said second reactant gas in the region above the substrate.

12. The method of claim 11 wherein said plasma is selected from the group consisting of direct current plasma, radio frequency plasma, electron cyclotron plasma, inductively coupled plasma, and microwave plasma.

13. The method of claim 1 wherein said aluminum source precursor has a formula $R^1 R^2 R^3$ Al, wherein $R^1$, $R^2$ and $R^3$ are independently H or lower alkyl.

14. The method of claim 13 wherein said lower alkyl is selected from the group consisting of methyl, ethyl, n-propyl, isopropyl, n-butyl, isobutyl, and tert-butyl.

15. The method of claim 13 wherein said aluminum source precursor is selected from the group consisting of tri-isobutylaluminum, disobutylaluminun hydride, trimethylaluminum, dimethylaluminum hydride, triethylaluminum, and diethylaluminun hydride.

16. The method of claim 1 wherein said aluminum source precursor is an aluminum halide.

17. The method of claim 16 wherein the aluminum halide is aluminum trichloride or aluminum tribromide.

18. The method of claim 1 wherein said aluminum source precursor is an aluminum tris(β-diketonate).

19. The method of claim 1 wherein said aluminum source precursor is an alkyl amide aluminum.

20. The method of claim 1 wherein said aluminum source precursor is a trialkylamine alane.

21. The method of claim 20 wherein the trialkylamine alane is dimethylethylamine alane, trimethylamine alane, and triethylamine alane.

22. The method of claim 1 wherein said copper is deposited from a precursor selected from the group consisting of copper(I)-tert-butoxide-tetramers, cyclopentadienyl-copper (I)-phosphine compounds, ligand stabilized copper(I) b-diketonates, and copper(II) β-diketonates.

23. The method of claim 1 comprising the further step of annealing said substrate.

24. The method of claim 1 wherein said second reactant vapor consists or an aluminum source precursor and a carrier gas selected from the group consisting of hydrogen, water vapor, alcohols, helium, argon, xenon, and nitrogen.

25. A chemical vapor deposition process for the in-situ preparation of conformal, copper-doped aluminum coatings on a substrate in a chemical vapor deposition (CVD) reactor comprising the steps of:
   a. heating said substrate to a temperature of 225–300° C.;
   b. generating a flow of first reactant vapor directed to said substrate in said reactor, said first reactant vapor including a copper source precursor chosen from copper N,N'-dimethylketenimidate, copper (II) hexafluoroacetylacetonate, or copper (I) trimethylvinylsilane;
   c. decomposing said first reactant vapor and depositing, directly on a surface of the substrate, a conformal copper layer with thickness of less than 10 nanometers;
   d. generating a flow of second reactant vapor directed to said substrate in said reactor, said second reactant vapor consisting of an aluminum source precursor chosen from dimethylethylaluminum alane and dimethylaluminum hydride, and optionally, a carrier gas; and
   e. decomposing said second reactant vapor and depositing a conformal copper-containing aluminum film over said copper layer.

26. The process of claim 25, wherein said first reactant vapor is generated by vaporizing a mixture of copper source precursor and isopropanol, wherein the concentration of said copper source precursor in isopropanol is 0.1–10 wt %.

* * * * *

UNITED STATES PATENT AND TRADEMARK OFFICE
CERTIFICATE OF CORRECTION

PATENT NO.    : 6,534,133 B1
DATED         : March 18, 2003
INVENTOR(S)   : Kaloyeros et al.

It is certified that error appears in the above-identified patent and that said Letters Patent is hereby corrected as shown below:

<u>Column 22,</u>
Line 33, delete the word "or" and insert the word -- of --

Signed and Sealed this

Thirteenth Day of May, 2003

JAMES E. ROGAN
*Director of the United States Patent and Trademark Office*